(12) United States Patent
Onishi et al.

(10) Patent No.: US 8,941,898 B2
(45) Date of Patent: Jan. 27, 2015

(54) SENSOR IC, CONTACT IMAGE SENSOR AND IMAGE READING APPARATUS

(71) Applicant: Rohm Co., Ltd., Kyoto-shi, Kyoto (JP)

(72) Inventors: Hiroaki Onishi, Kyoto (JP); Kuniaki Nakamura, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 13/943,199

(22) Filed: Jul. 16, 2013

(65) Prior Publication Data
US 2014/0029072 A1    Jan. 30, 2014

(30) Foreign Application Priority Data
Jul. 17, 2012   (JP) ................................ 2012-158658

(51) Int. Cl.
*H04N 1/46*     (2006.01)
*G03F 3/08*     (2006.01)
(Continued)

(52) U.S. Cl.
CPC .... *H01L 27/14605* (2013.01); *H01L 27/14621* (2013.01); *H01L 27/14678* (2013.01); *H04N 5/3692* (2013.01); *H04N 9/07* (2013.01); *H04N 1/0318* (2013.01); *H04N 1/1938* (2013.01); *H04N 1/486* (2013.01); *H01L 27/14627* (2013.01); *H04N 1/12* (2013.01); *H04N 2201/0081* (2013.01); *H04N 2201/03112* (2013.01); *H04N 2201/03125* (2013.01); *H04N 2201/03133* (2013.01); *H04N 2201/03141* (2013.01); *H04N 2201/03145* (2013.01)
USPC ........... 358/513; 358/518; 358/512; 358/514; 358/1.9; 358/461; 358/483; 250/208.1; 250/205

(58) Field of Classification Search
USPC ........ 358/513, 518, 512, 514; 250/208.1, 205
See application file for complete search history.

(56) References Cited

U.S. PATENT DOCUMENTS 5,587,814 A * 12/1996 Mihara et al. ................. 358/512
5,805,314 A *  9/1998 Abe et al. ...................... 358/518
(Continued)

FOREIGN PATENT DOCUMENTS

JP     2006-332250     12/2006

*Primary Examiner* — Charlotte M Baker
*Assistant Examiner* — Rury Grisham
(74) *Attorney, Agent, or Firm* — Hamre, Schumann, Mueller & Larson, P.C.

(57) ABSTRACT

A sensor IC of the present invention is provided with plurality of light receiving portions arranged in a row along a primary scanning direction and including a first light receiving portion for receiving light of a first wavelength, a second light receiving portion for receiving light of a second wavelength different from the first wavelength, and a third light receiving portion for receiving light of a third wavelength different from the first wavelength and the second wavelength. The sensor IC further includes a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion.

20 Claims, 28 Drawing Sheets

(51) Int. Cl.
*H04N 1/40* (2006.01)
*H04N 1/04* (2006.01)
*H04N 1/60* (2006.01)
*H01L 27/00* (2006.01)
*G01J 1/32* (2006.01)
*H01L 27/146* (2006.01)
*H04N 5/369* (2011.01)
*H04N 9/07* (2006.01)
*H04N 1/031* (2006.01)
*H04N 1/193* (2006.01)
*H04N 1/48* (2006.01)
*H04N 1/12* (2006.01)

(56) References Cited

U.S. PATENT DOCUMENTS

| | | | |
|---|---|---|---|
| 7,339,150 B2 * | 3/2008 | Ohara | 250/208.1 |
| 2004/0223196 A1 * | 11/2004 | Tanimoto et al. | 358/514 |
| 2005/0199781 A1 * | 9/2005 | Kamisuwa et al. | 250/208.1 |
| 2009/0039234 A1 * | 2/2009 | Yamamoto et al. | 250/205 |

* cited by examiner

US 8,941,898 B2

SENSOR IC, CONTACT IMAGE SENSOR AND IMAGE READING APPARATUS

BACKGROUND OF THE INVENTION

1. Field of the Invention

The present invention relates to a sensor IC, a contact image sensor and an image reading apparatus for reading color documents.

2. Description of the Related Art

Sensor ICs for reading color documents have conventionally been proposed (see, e.g. JP-2006-332250). FIG. 28 schematically illustrates a light receiving portion 90 of a conventional sensor IC. The light receiving portion 90 shown in the figure includes three light-receiving-element rows 91, 92 and 93. Each of the light-receiving-element rows 91, 92, 93 has a plurality of light-receiving elements 911, 921, or 931 aligned in the primary scanning direction x. These rows are provided with color filters of three primary colors, red, green and blue, respectively. Specifically, the light-receiving-element row 91 is provided with a color filter that passes red light, the light-receiving-element row 92 is provided with a color filter that passes green light, and the light-receiving-element row 93 is provided with a color filter that passes blue light. The sensor IC having this structure is used as incorporated in e.g. a contact image sensor. The contact image sensor further includes a light source for illuminating a document and a lens array for guiding the light reflected by the document to the light receiving portion 90. The contact image sensor simultaneously reads three colors by scanning while illuminating the document by the light source.

In the conventional sensor IC, the width of the light receiving portion 90 in the secondary scanning direction y is large because the light-receiving-element rows 91, 92 and 93 are arranged parallel to each other. For instance, when compared with a light receiving portion including a single light-receiving-element row, the width of the light receiving portion 90 is about five times as large as that of the light receiving portion having a single light-receiving-element row. To uniformly illuminate a region corresponding to the light receiving portion 90, a large amount of light needs to be emitted from the light source, and variations of the light amount in the secondary scanning direction y needs to be avoided. Since the lens array has a difference in index of refraction between a position close to the optical axis and a position distant from the optical axis, passing the light having a large width in the secondary scanning direction y hinders enhancement of reading quality.

In recent years, the reading of light outside the visible light range, such as infrared light, is sometimes demanded in addition to the reading of visible light. In such a case, the width of the light receiving portion 90 tends to increase, which makes the above-described problem more serious.

SUMMARY OF THE INVENTION

A first object of the preset invention is to provide a sensor IC having a relatively narrow light receiving portion. The invention further provides a contact image sensor and an image reading apparatus which achieves enhanced accuracy of reading by incorporating such a sensor IC.

A second object of the present invention is to provide a sensor IC which is capable of reading light outside the visible light range without increasing the width of the light receiving portion. The invention further provides a contact image sensor and an image reading apparatus which are capable of reading light outside the visible light range and achieve enhanced accuracy of reading by incorporating such a sensor IC.

A sensor IC provided according to a first aspect of the present invention includes: a plurality of light receiving portions which include a first light receiving portion that receives light of a first wavelength, a second light receiving portion that receives light of a second wavelength different from the first wavelength, and a third light receiving portion that receives light of a third wavelength different from the first wavelength and the second wavelength which are arranged in a row along a primary scanning direction; and a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion.

Preferably, the first light receiving portion includes a first color filter that passes light of the first wavelength and a first photo-electric conversion element that receives light passing through the first color filter. The second light receiving portion includes a second color filter that passes light of the second wavelength and a second photo-electric conversion element that receives light passing through the second color filter. The third light receiving portion includes a third color filter that passes light of the third wavelength and a third photo-electric conversion element that receives light passing through the third color filter.

Preferably, the sensor IC further includes a first output terminal that outputs the first electric signal, a second output terminal which outputs the second electric signal and which is provided separately from the first output terminal, and a third output terminal which outputs the third electric signal and which is provided separately from the first output terminal and the second output terminal.

In an embodiment to achieve the second object of the present invention, the first light receiving portion, the second light receiving portion and the third light receiving portion receive visible light. The light receiving portions include a fourth light receiving portion that receives light of a fourth wavelength included in an invisible light range. The control circuit outputs a fourth electric signal corresponding to light received by the fourth light receiving portion.

Preferably, the sensor IC includes a first output terminal which outputs the first electric signal, a second output terminal which outputs the second electric signal and which is provided separately from the first output terminal, a third output terminal which outputs the third electric signal and which is provided separately from the first output terminal and the second output terminal, and a fourth output terminal which outputs the fourth electric signal and which is provided separately from the first output terminal, the second output terminal and the third output terminal.

A sensor IC provided according to a second aspect of the present invention includes: a plurality of light receiving portions which include a first light receiving portion that receives light of a first wavelength and a second light receiving portion that receives light of a second wavelength different from the first wavelength and which are arranged in a row along a primary scanning direction; and a plurality of additional light receiving portions which are provided at different positions from the light receiving portions in a secondary scanning direction and which are arranged in a row along the primary scanning direction. The additional light receiving portions include a third light receiving portion that receives light of a third wavelength different from the first wavelength and the second wavelength. The sensor IC further includes a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion.

Preferably, the above-mentioned plurality of light receiving portions include a plurality of first light receiving portions and a plurality of second light receiving portions, where the first light receiving portions and the second light receiving portions are alternately arranged. The above-mentioned plurality of additional light receiving portions include a plurality of third light receiving portions, and a plurality of fourth light receiving portions that receive light of a wavelength different from light of the third wavelength. The third light receiving portions and the fourth light receiving portions are alternately arranged.

Preferably, the fourth light receiving portions receive light of the first wavelength, and the control circuit outputs a fourth electric signal corresponding to light of the first wavelength received by the fourth light receiving portions.

Preferably, each of the third light receiving portions is disposed at a same position as one of the first light receiving portions in the primary scanning direction, and each of the fourth light receiving portions is disposed at a same position as one of the second light receiving portions in the primary scanning direction.

In an embodiment to achieve the second object of the present invention, the first light receiving portions, the second light receiving portions and the third light receiving portions receive visible light, and the fourth light receiving portions receive light of a fourth wavelength included in an invisible light range.

A contact image sensor provided according to a third aspect of the present invention includes: a sensor IC provided according to the first aspect of the present invention; a light source that emits light of the first wavelength, light of the second wavelength and light of the third wavelength for illuminating a read object; and a lens array that focuses light from the read object onto the sensor IC to form an erected equal-magnification image.

Preferably, the light source includes a light emitting portion provided with an LED chip, and a light guide member elongated in the primary scanning direction for guiding light emitted from the light emitting portion.

A contact image sensor provided according to a fourth aspect of the present invention includes: a sensor IC provided according to the first aspect of the present invention and for achieving the second object of the present invention; a light source that emits light including light of the first wavelength, light of the second wavelength, light of the third wavelength and light of the fourth wavelength for illuminating a read object; and a lens array that focuses light from the read object onto the sensor IC to form an erected equal-magnification image.

Preferably, the light source includes a light emitting portion provided with an LED chip, and a light guide member elongated in the primary scanning direction for guiding light emitted from the light emitting portion.

More preferably, the LED chip emits light of the fourth wavelength.

A contact image sensor provided according to a fifth aspect of the present invention includes: a sensor IC provided according to the second aspect of the present invention; a light source that emits light of the first wavelength, light of the second wavelength and light of the third wavelength for illuminating a read object; and a lens array that focuses light from the read object onto the sensor IC to form an erected equal-magnification image.

Preferably, the light source includes a light emitting portion provided with an LED chip, and a light guide member elongated in the primary scanning direction for guiding light emitted from the light emitting portion.

A contact image sensor provided according to a sixth aspect of the present invention includes: a sensor IC provided according to the second aspect of the present invention and for achieving the second object of the present invention; a light source that emits light of the first wavelength, light of the second wavelength, light of the third wavelength and light of the fourth wavelength for illuminating a read object; and a lens array that focuses light from the read object onto the sensor IC to form an erected equal-magnification image.

Preferably, the light source includes a light emitting portion provided with an LED chip, and a light guide member elongated in the primary scanning direction for guiding light emitted from the light emitting portion.

Preferably the LED chip emits light of the fourth wavelength.

An image reading apparatus provided according to a seventh aspect of the present invention includes a contact image sensor provided according to the third or the fourth aspect of the present invention, and a signal processor that receives the first electric signal, the second electric signal and the third electric signal. The signal processor outputs a plurality of picture element information pieces each of which includes: a first color information piece based on the first electric signal; a second color information piece based on the second electric signal; and a third color information piece based on the third electric signal.

Preferably, every time the sensor IC performs scanning, the signal processor outputs a larger number of picture element information pieces than a number of the first light receiving portions.

Preferably, the signal processor performs processing by dividing the light receiving portions into a plurality of light receiving groups aligned along the primary scanning direction, and each of the light receiving groups includes the first light receiving portion, the second light receiving portion and the third light receiving portion.

Preferably, the light receiving groups include a first light receiving group and a second light receiving group positioned next to the first light receiving group. The signal processor outputs a first picture element information piece that is one of the picture element information pieces. The first picture element information piece includes: a first color information piece based on a first electric signal from a first light receiving portion belonging to the second light receiving group; a second color information piece obtained from both a second electric signal from a second light receiving portion belonging to the first light receiving group and a second electric signal from a second light receiving portion belonging to the second light receiving group; and a third color information piece obtained from both a third electric signal from a third light receiving portion belonging to the first light receiving group and a third electric signal from a third light receiving portion belonging to the second light receiving group.

Preferably, the light receiving groups further include a third light receiving group positioned next to the second light receiving group, and the signal processor outputs a second picture element information piece that is one of the picture element information pieces. The second picture element information piece includes: a first color information piece obtained from both a first electric signal from the first light receiving portion belonging to the second light receiving group and a first electric signal from a first light receiving portion belonging to the third light receiving group; a second color information piece based on a second electric signal from the second light receiving portion belonging to the second light receiving group; and a third color information piece obtained from both a third electric signal from the third light receiving portion belonging to the first light receiving group and a third electric signal from the third light receiving portion belonging to the second light receiving group.

In another preferred embodiment of the present invention, the signal processor performs processing by dividing the light receiving portions into a plurality of light receiving groups aligned along the primary scanning direction. The light receiving groups include: a first light receiving group including the first light receiving portion and the second light receiving portion; and a second light receiving group positioned next to the first light receiving group and including the second light receiving portion and the third light receiving portion.

Preferably, the signal processor outputs a first picture element information piece that is one of the picture element information pieces. The first picture element information piece includes: a first color information piece based on a first electric signal from a first light receiving portion belonging to the first light receiving group; a second color information piece based on a second electric signal from a second light receiving portion belonging to the first light receiving group; and a third color information piece obtained by using a third electric signal from a third light receiving portion belonging to the second light receiving group.

Preferably, the light receiving groups include a third light receiving group which includes the first light receiving portion and the second light receiving portion and which is positioned on the opposite side of the first light receiving group with respect to the second light receiving group and positioned adjacent to the second light receiving group. The signal processor outputs a second picture element information piece that is one of the picture element information pieces. The second picture element information piece includes: a first color information piece obtained by using a first electric signal from a first light receiving portion belonging to the first light receiving group and a first electric signal from a first light receiving portion belonging to the third light receiving group; a second color information piece based on a second electric signal from a second light receiving portion belonging to the second light receiving group; and a third color information piece based on a third electric signal from a third light receiving portion belonging to the second light receiving group.

An image reading apparatus provided according to an eighth aspect of the present invention includes a contact image sensor provided according to a fifth or a sixth aspect of the present invention, a transferer for moving the read object relative to the contact image sensor, a controller that controls the transferer, and a signal processor that receives the first electric signal, the second electric signal and the third electric signal. The signal processor outputs a plurality of picture element information pieces each of which includes: a first color information piece based on the first electric signal; a second color information piece based on the second electric signal; and a third color information piece based on the third electric signal.

Preferably, the light receiving portions include the first light receiving portion and the second light receiving portion arranged adjacent to each other. The additional light receiving portions include the third light receiving portion arranged adjacent to the first light receiving portion. The signal processor outputs a first picture element information piece that is one of the picture element information pieces. The first picture element information piece includes: a first color information piece based on a first electric signal from the first light receiving portion; a second color information piece based on a second electric signal from the second light receiving portion; and a third color information piece based on a third electric signal from the third light receiving portion.

Preferably, the controller controls the transferer in such a manner that the transferer moves the read object relative to the contact image sensor by a feeding width approximately equal to a sum of a pitch of the light receiving portions and a pitch of the additional light receiving portions every time the sensor IC performs scanning operation.

Preferably, the light receiving portions include an additional first light receiving portion positioned on the opposite side of the first light receiving portion with respect to the second light receiving portion and positioned adjacent to the second light receiving portion. The additional light receiving portions include an additional third light receiving portion adjacent to the additional first light receiving portion. The signal processor further outputs a second picture element information piece that is one of the picture element information pieces. The second picture element information piece includes: a first color information piece based on a first electric signal from the additional first light receiving portion; a second color information piece based on a second electric signal from the second light receiving portion; and a third color information piece obtained by using a third electric signal from the additional third light receiving portion.

Preferably, the controller controls the transferer in such a manner that the transferer moves the read object relative to the contact image sensor by a feeding width corresponding to the pitch of the light receiving portions every time the sensor IC performs scanning operation.

Other features and advantages of the present invention will become more apparent from detailed description given below with reference to the accompanying drawings.

DESCRIPTION OF THE PREFERRED EMBODIMENTS

Preferred embodiments of the present invention are described below with reference to the accompanying drawings.

Figure 1:
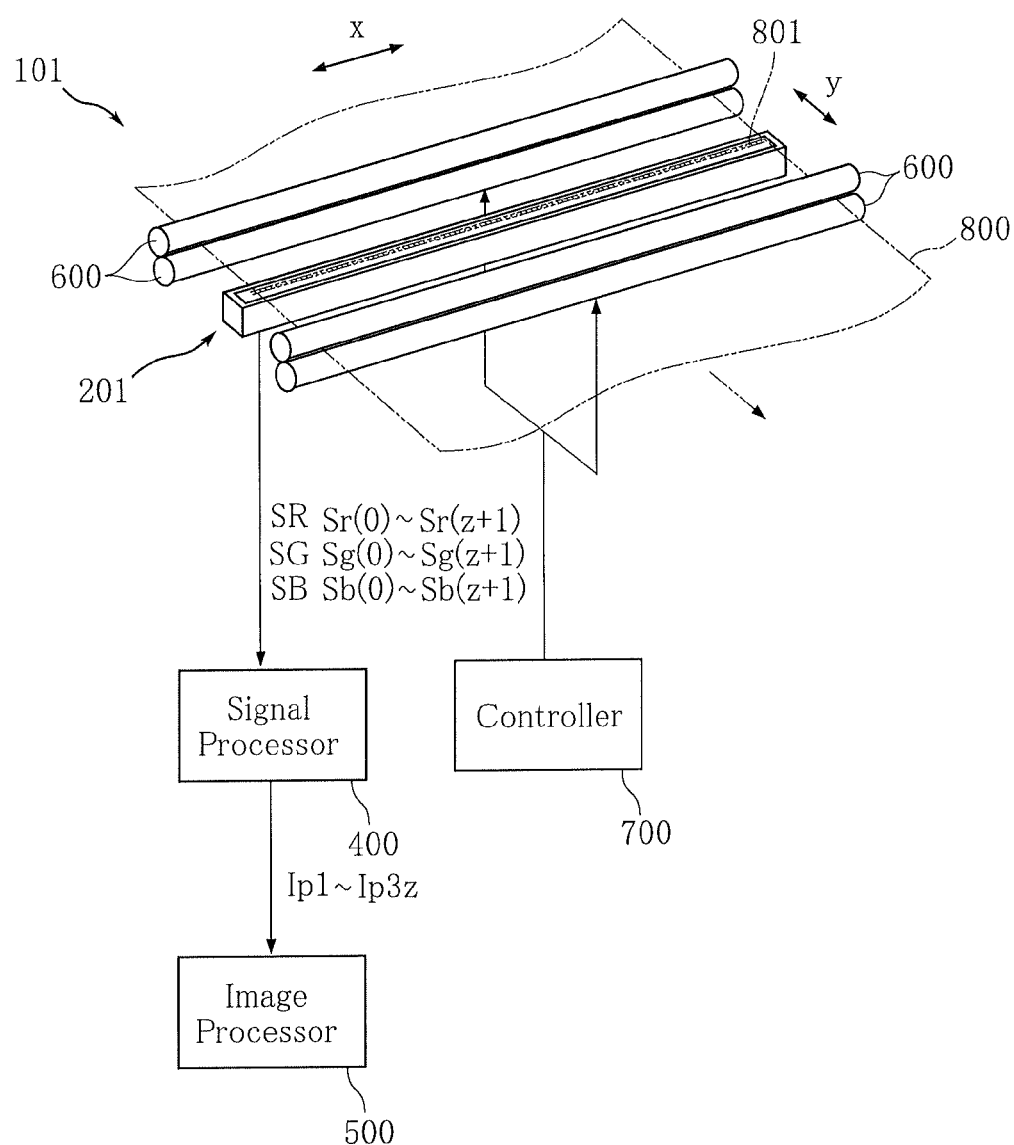
FIG. 1 is a schematic structural view showing an image reading apparatus according to a first embodiment of the present invention.

FIG. 1 shows an image reading apparatus according to a first embodiment of the present invention. The image reading apparatus 101 of this embodiment includes a contact image sensor 201, a signal processor 400, an image processor 500, a transferer 600 and a controller 700. The image reading apparatus 101 has a primary scanning direction x and a secondary scanning direction y perpendicular to the primary scanning direction x and reads a read region 801 in the form of a thin elongated strip extending in the primary scanning direction x by a single scanning operation while transferring the read object 800 in the secondary scanning direction y. The read object 800 of this embodiment is a color document such as a photograph.

Figure 2:
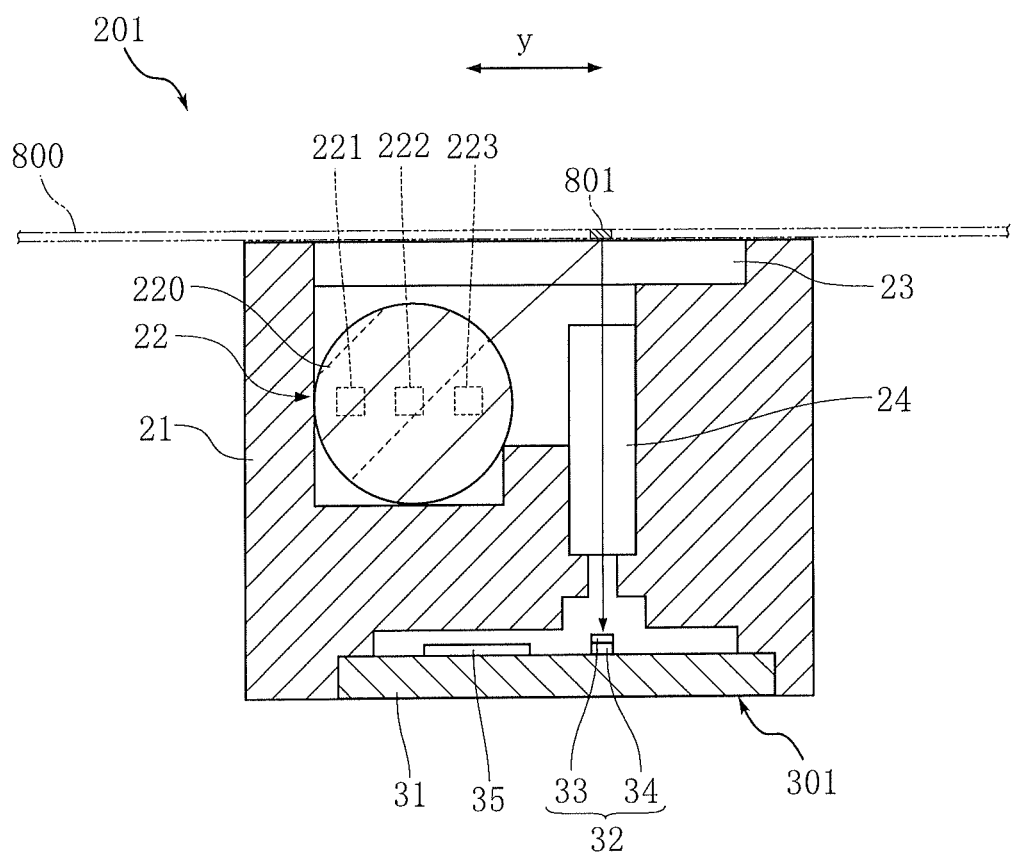
FIG. 2 is a schematic sectional view of the contact image sensor shown in FIG. 2.

FIG. 2 is a schematic sectional view of the contact image sensor 201, taken along a plane perpendicular to the primary scanning direction x. As shown in FIG. 2, the contact image sensor 201 includes a sensor IC 301, a housing 21, a light source 22, a light-transmitting cover 23 and a lens array 24.

The housing 21 constitutes the majority of the appearance of the contact image sensor 201 and is in the form of a rectangular parallelepiped elongated in the primary scanning direction x. As shown in FIG. 2, the housing 21 is open in the vertical direction in the figure. The light-transmitting cover 23 is fitted in the upper opening of the housing, whereas the sensor IC 301 is fitted in the lower opening of the housing. The light source 22 and the lens array 24 are housed in the housing 21.

The light source 22 includes a red LED chip 221 that emits red light, a green LED chip 222 that emits green light, a blue LED chip 223 that emits blue light, and an elongated light guide member 220 extending in the primary scanning direction x. The light guide member 220 is made of e.g. acrylic resin. The light guide member causes a part of the light emitted from the red LED chip 221, the green LED chip 222 and the blue LED chip 223 to travel toward the read region 801 while guiding the light in the primary scanning direction x.

As shown in FIG. 2, the lens array 24 is disposed directly below the read region 801 in the figure and focuses the light from the read region 801 onto the sensor IC 301 to form an erected equal-magnification image. For instance, this lens array 24 is provided by arranging a plurality of rod lenses along the primary scanning direction x.

Figure 3:
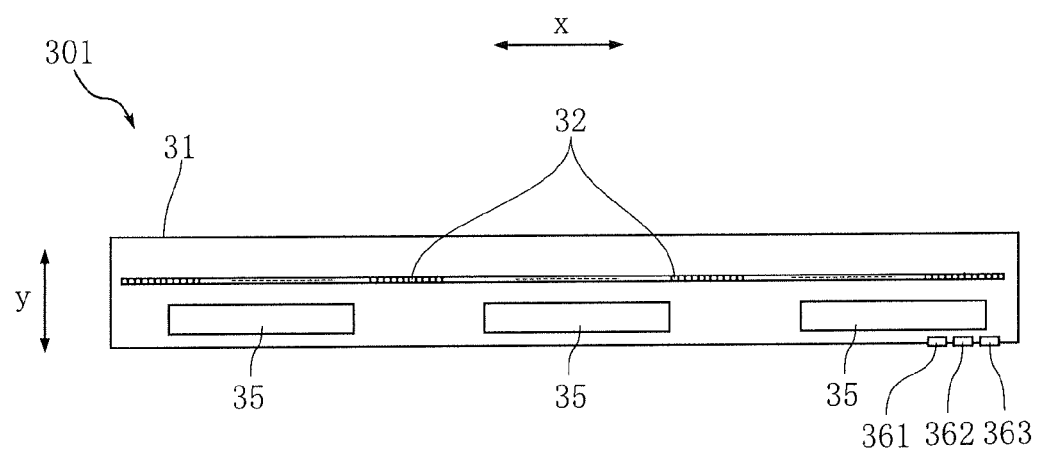
FIG. 3 is a schematic plan view of the sensor IC shown in FIG. 2.

As shown in FIGS. 2 and 3, the sensor IC 301 includes a substrate 31, a plurality of light receiving portions 32 mounted on the substrate 31, control circuits 35 connected to the light receiving portions 32, and three output terminals 361, 362, 363 connected to the control circuits 35.

The substrate 31 is made of e.g. glass epoxy resin and in the form of an elongated rectangle extending in the primary scanning direction x as shown in FIG. 3. The light receiving portions 32 are arranged on the substrate 31 at regular intervals in a row extending in the primary scanning direction x. As shown in FIG. 2, the light receiving portions 32 are positioned directly below the lens array 24.

As shown in FIG. 2, each of the light receiving portions 32 includes a color filter 33 and a photo-electric conversion element 34. The color filter 33 is provided on the upper side of the photo-electric conversion element 34 in the figure. Of the light from the lens array 24, only the light passing through the color filter 33 impinges on the photo-electric conversion element 34. The color filter 33 may be one of the color filters 33$r$, 33$g$ and 33$b$ described later and the photo-electric conversion element 34 may be one of the photo-electric conversion elements 34$r$, 34$g$ and 34$b$ described later.

Figure 4:
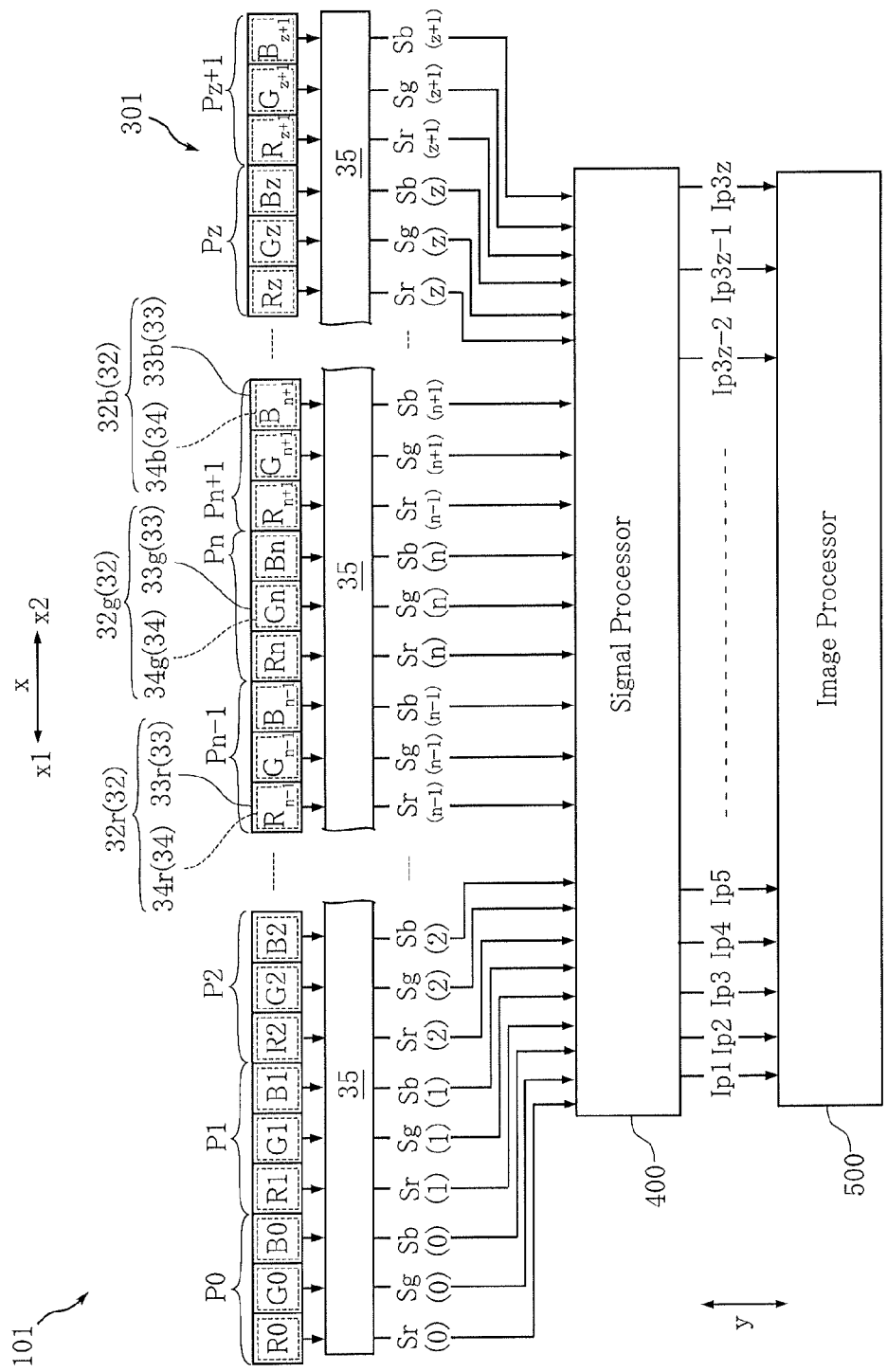
FIG. 4 is a view for describing the structure of the image reading apparatus shown in FIG. 1.

As shown in FIG. 4, the light receiving portions 32 include light receiving portions 32$r$ that convert light of a first wavelength into electric signals, light receiving portions 32$g$ that convert light of a second wavelength different from the first wavelength into electric signals, and light receiving portions 32$b$ that convert light of a third wavelength different from the first wavelength and the second wavelength into electric signals. Light of the first wavelength is red light emitted from the red LED chip 221, light of the second wavelength is green light emitted from the green LED chip 222, and light of the third wavelength is blue light emitted from the blue LED chip 223. The light receiving portions 32$r$ correspond to the first light receiving portion recited in the claims, the light receiving portions 32$g$ correspond to the second light receiving portion recited in the claims, and the light receiving portions 32$b$ correspond to the third light receiving portion recited in the claims.

In this embodiment, the light receiving portions 32 are made up of z+2 (z: an integer not smaller than 1) light receiving portions 32$r$, z+2 light receiving portions 32$g$ and z+2 light receiving portions 32$b$. For convenience, in FIG. 4, the light receiving portions 32$r$ are expressed as R0 . . . Rz+1 in the order along the primary scanning direction x, the light receiving portions 32$g$ are expressed as G0 . . . Gz+1 in the order along the primary scanning direction x, and the light receiving portions 32b are expressed as B0 ... Bz+1 in the order along the primary scanning direction x. The numbers applied to the light receiving portion 32r, 32g, 32b become smaller as proceeding to the left in the figure (to the x1 side in the primary scanning direction). As shown in FIG. 4, a plurality of groups each consisting of three light receiving portions, i.e., a light receiving portion 32r, a light receiving portion 32g and a light receiving portion 32b aligned in the order of R, G, B are successively arranged.

Each light receiving portion 32r includes a color filter 33r that passes red light and a photo-electric conversion element 34r that receives red light passing through the color filter 33r. Each light receiving portion 32g includes a color filter 33g that passes green light and a photo-electric conversion element 34g that receives green light passing through the color filter 33g. Each light receiving portion 32b includes a color filter 33b that passes blue light and a photo-electric conversion element 34b that receives blue light passing through the color filter 33b. Though indicated by different reference signs for convenience, the photo-electric conversion elements 34r, 34g and 34b may be photo-electric conversion elements of the same type.

The control circuits 35 output electric signals corresponding to the light received by the light receiving portions 32. When the photo-electric conversion element 34 of a light receiving portion 32 receives light, the photo-electric conversion element 34 sends to a control circuit 35 an electric signal corresponding to the intensity of the light. The control circuit 35 amplifies the electric signal from the photo-electric conversion element 34 and outputs the signal. In this embodiment, as shown in FIG. 3, three control circuits 35 are aligned as spaced apart from each other in the primary scanning direction x. To reduce attenuation of electric signals, each of the light receiving portions 32 is connected to one of the control circuits 35 that is relatively close.

Specifically, the control circuits 35 amplify electric signals from the light receiving portions 32r expressed as R0 ... Rz+1 in FIG. 4 to output electric signals Sr(0) ... Sr(z+1). Each of the electric signals Sr(0) ... Sr(z+1) is based on the electric signal from the same-numbered, corresponding one of the light receiving portions R0 ... Rz+1. These electric signals Sr(0) ... Sr(z+1) correspond to the first electric signal recited in the claims.

The control circuits 35 amplify electric signals from the light receiving portions 32g expressed as G0 ... Gz+1 in FIG. 4 to output electric signals Sg(0) ... Sg(z+1). Each of the electric signals Sg(0) ... Sg(z+1) is based on the electric signal from the same-numbered corresponding one of the light receiving portions G0 ... Gz+1. These electric signals Sg(0) ... Sg(z+1) correspond to the second electric signal recited in the claims.

The control circuits 35 amplify electric signals from the light receiving portions 32b expressed as B0 ... Bz+1 in FIG. 4 to output electric signals Sb(0) ... Sb(z+1). Each of the electric signals Sb(0) ... Sb(z+1) is based on the electric signal from the same numbered, corresponding one of the light receiving portions B0 ... Bz+1. These electric signals Sb(0) ... Sb(z+1) correspond to the third electric signal recited in the claims.

The output terminal 361 outputs to the signal processor 400 the electric signals Sr(0) ... Sr(z+1) outputted from the control circuits 35. The output terminal 362 outputs to the signal processor 400 the electric signals Sg(0) ... Sg(z+1) outputted from the control circuits 35. The output terminal 363 outputs to the signal processor 400 the electric signals Sb(0) ... Sb(z+1) outputted from the control circuits 35.

Although the electric signals Sr(0) ... Sr(z+1) are shown side by side in FIG. 4 for convenience of description, the electric signals Sr(0) ... Sr(z+1) are successively transmitted from the output terminal 361 to the signal processor 400 in numerical order. Similarly, the electric signals Sg(0) ... Sg(z+1) are successively transmitted from the output terminal 362 to the signal processor 400 in numerical order, and electric signals Sb(0) ... Sb(z+1) are successively transmitted from the output terminal 363 to the signal processor 400 in numerical order. Hereinafter, electric signals Sr(0) ... Sr(z+1) outputted from the output terminal 361 are collectively expressed as electric signal SR, electric signal Sg(0) ... Sg(z+1) outputted from the output terminal 362 are collectively expressed as electric signal SG, electric signals Sb(0) ... Sb(z+1) outputted from the output terminal 363 are collectively expressed as electric signal SB.

The signal processor 400 receives electric signals SR, SG and SB outputted from the sensor IC 301, generates a plurality of picture element information pieces based on the received electric signals, and transmits the generated picture element information pieces to the image processor 500. Each of the picture element information pieces includes color information of three colors, red, green and blue. Based on the picture element information pieces, the image processor 500 forms a color read image of the read region 801.

Figure 5:
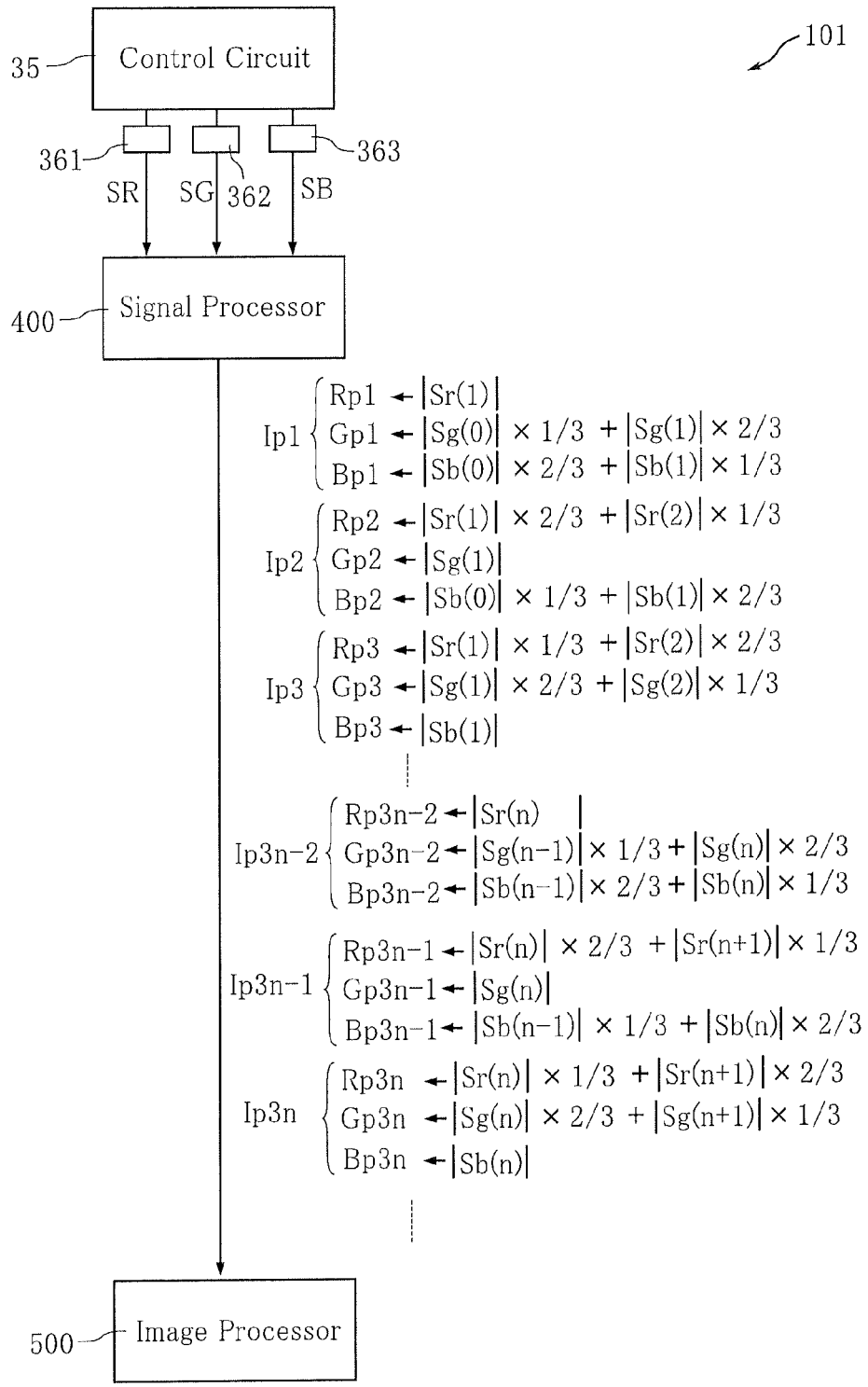
FIG. 5 is a view for describing the operation of the image reading apparatus shown in FIG. 1.
Figure 6:
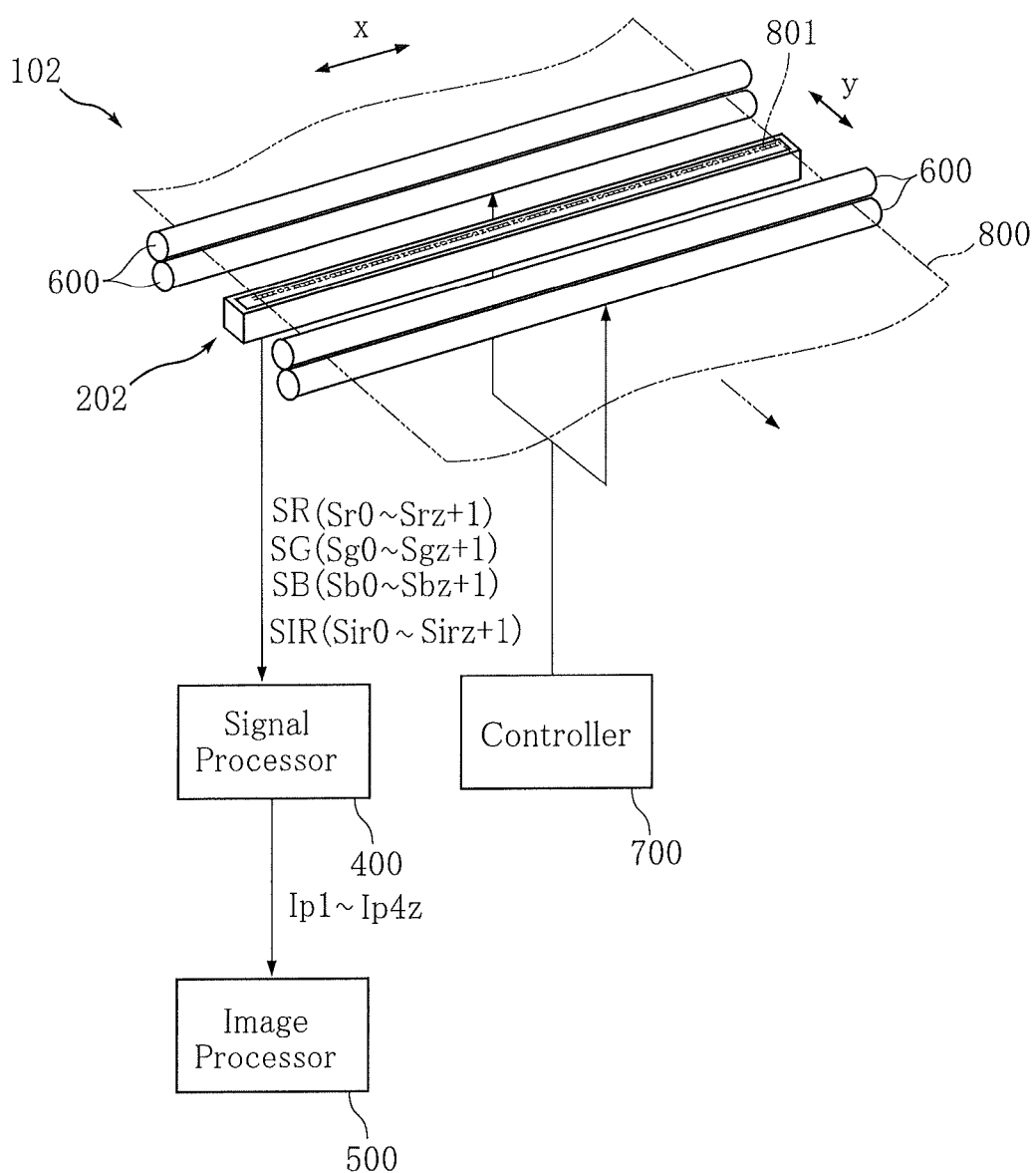
FIG. 6 is a schematic structural view showing an image reading apparatus according to a second embodiment of the present invention.

Signal processing by the signal processor 400 is described below with reference to FIGS. 4 and 5.

The signal processor 400 generates 3z picture element information pieces Ip1 ... Ip3z from the electric signals SR, SG and SB. The picture element information piece Ipn includes a red color information piece Rpn, a green color information piece Gpn and a blue color information piece Bpn, where n is an integer not smaller than 1 and not larger than z. Red color information pieces Rp1 ... Rpz are obtained by using the intensities $|Sr(0)|$ ... $|Sr(z+1)|$ of the electric signals Sr(0) ... Sr(z+1). Green color information pieces Gp1 ... Gpz are obtained by using the intensities $|Sg(0)|$ ... $|Sg(z+1)|$ of the electric signals Sg(0) ... Sg(z+1). Blue color information pieces Bp1 ... Bpz are obtained by using the intensities $|Sb(0)|$ ... $|Sb(z+1)|$ of the electric signals Sb(0) ... Sb(z+1).

The signal processor 400 performs processing by dividing the light receiving portions 32 into a plurality of light receiving groups P0 ... Pz+1 aligned in the primary scanning direction x. Each of the light receiving groups P0 ... Pz+1 includes the corresponding light receiving portions 32r, 32g and 32b having the same number among R0 ... Rz+1, G0 ... Gz+1, B0 ... Bz+1. Specifically, referring to FIG. 4, the light receiving group P0 consists of the light receiving portion 32r expressed as R0, the light receiving portion 32g expressed as G0 and the light receiving portion 32b expressed as B0. The light receiving group Pn consists of the light receiving portion 32r expressed as Rn, the light receiving portion 32g expressed as Gn, and the light receiving portion 32b expressed as Bn. The light receiving group Pz+1 consists of the light receiving portion 32r expressed as Rz+1, the light receiving portion 32g expressed as Gz+1, and the light receiving portion 32b expressed as Bz+1.

The signal processor 400 uses electric signals from at least two of the light receiving groups P0 ... Pz+1 to generate a single picture element information piece which is one of the picture element information pieces Ip1 ... Ip3z.

Specifically, the signal processor 400 generates a picture element information piece Ip1 based on the electric signals Sg(0), Sb(0) from the light receiving portions 32g, 32b belonging to the light receiving group P0, and the electric signals Sr(1), Sg(1), Sb(1) from the light receiving portions 32r, 32g, 32b belonging to the light receiving group P1. For instance, the red color information piece Rp1 of the picture element information piece Ip1 is expressed by the intensity |Sr(1)| of the electric signal Sr(1) (see FIG. 5). For instance, the green color information piece Gp1 of the picture element information piece Ip1 is obtained by using the intensity |Sg(0)| of the electric signal Sg(0) and the intensity |Sg(1)| of the electric signal Sg(1) and expressed by |Sg(0)|×⅓+|Sg(1)|×⅔. For instance, the blue color information piece Bp1 of the picture element information piece Ip1 is obtained by using the intensity |Sb(0)| of the electric signal Sb(0) and the intensity |Sb(1)| of the electric signal Sb(1) and expressed by |Sb(0)|×⅔+|Sb(1)|×⅓.

As seen from the fact that the red color information piece Rp1 of the picture element information piece Ip1 is expressed by the intensity of the electric signal Sr(1), the picture element information piece Ip1 is the information related to a portion of the light receiving region 801 which faces the light receiving portion 32r expressed as R1. Since the light receiving portion 32r does not receive green light and blue light, the green color information piece Gp1 and the blue color information piece Bp1 would remain unknown without taking any measures. In this embodiment, the signal processor 400 complements the green color information piece Gp1 and the blue color information piece Bp1. Specifically, the green color information piece Gp1 is generated based on the electric signal Sg(1) from the light receiving portion 32g (expressed as G1 in FIG. 4) closest to the light receiving portion 32r expressed as R1 in FIG. 4 and the electric signal Sg(0) from the light receiving portion 32g (expressed as G0 in FIG. 4) next closest to the light receiving portion 32r. In view of the positional relationship, the coefficients of the above-described expression are determined in such a manner that the electric signal Sg(1) from the closest light receiving portion 32g (expressed as G1 in FIG. 4) has a larger influence.

The signal processor 400 generates a picture element information piece Ip2 based on the electric signal Sb(0) from the light receiving portion 32b belonging to the light receiving group P0, the electric signals Sr(1), Sg(1), Sb(1) from the light receiving portions 32r, 32g, 32b belonging to the light receiving group P1, and the electric signal Sr(2) from the light receiving portion 32r belonging to the light receiving group P2. The red color information piece Rp2 of the picture element information piece Ip2 is obtained by using the intensity |Sr(1)| and the intensity |Sr(2)| of the electric signal Sr(2) and expressed by |Sr(1)|×⅔+|Sr(2)|×⅓. The green color information piece Gp2 is expressed by the intensity |Sg(1)|. The blue color information piece Bp2 is obtained by using the intensity |Sb(0)| and the intensity |Sb(1)| and expressed by |Sb(0)|×⅓+|Sb(1)|×⅔.

The signal processor 400 generates a picture element information piece Ip3 based on the electric signals Sr(1), Sg(1), Sb(1) from the light receiving portions 32r, 32g, 32b belonging to the light receiving group P1, and electric signals Sr(2), Sg(2) from the light receiving portions 32r, 32g belonging to the light receiving group P2. The red color information piece Rp3 of the picture element information piece Ip3 is obtained by using the intensity |Sr(1)| and the intensity |Sr(2)| and expressed by |Sr(1)|×⅓+|Sr(2)|×⅔. The green color information piece Gp3 is obtained by using the intensity |Sg(1)| and the intensity |Sg(2)| of the electric signal Sg(2) and expressed by |Sg(1)|×⅔+|Sg(2)|×⅓. The blue color information piece Bp3 is expressed by the intensity |Sb(1)|.

The picture element information pieces Ip4 . . . Ip3z of the subsequent numbers are similarly generated based on signals from a plurality of light receiving groups P0 . . . Pz+1. FIG. 5 also shows a picture element information piece Ip3n−2, a picture element information piece Ip3n−1 and a picture element information piece Ip3n, where "n" is as described above.

The red color information Rp3n−2 of the picture element information piece Ip3n−2 is expressed by the intensity |Sr(n)| of the electric signal Sr(n). The green color information piece Gp3n−2 is obtained by using the intensity |Sg(n−1)| of the electric signal Sg(n−1) and the intensity |Sg(n)| of the electric signal Sg(n) and expressed by |Sg(n−1)|×⅓+|Sg(n)|×⅔. The blue color information piece Bp3n−2 is obtained by using e.g. the intensity |Sb(n−1)| of the electric signal Sb(n−1) and the intensity |Sb(n)| of the electric signal Sb(n) and expressed by |Sb(n−1)|×⅔+|Sb(n)|×⅓.

The red color information piece Rp3n−1 of the picture element information piece Ip3n−1 is obtained by using the intensity |Sr(n)| and the intensity |Sr(n+1)| of the electric signal Sr(n+1) and expressed by |Sr(n)|×⅔+|Sr(n+1)|×⅓. The green color information piece Gp3n−1 is expressed by the intensity |Sg(n)|. The blue color information piece Bp3n−1 is obtained by using the intensity |Sb(n−1)| and the intensity |Sb(n)| and expressed by |Sb(n−1)|×⅓+|Sb(n)|×⅔.

The red color information piece Rp3n of the picture element information piece Ip3n is obtained by using the intensity |Sr(n)| and the intensity |Sr(n+1)| and expressed by |Sr(n)|×⅓+|Sr(n+1)|×⅔. The green color information piece Gp3n is obtained by using the intensity |Sg(n)| and the intensity |Sg(n+1)| of the electric signal Sg(n+1) and expressed by |Sg(n)|×⅔+|Sg(n+1)|×⅓. The blue color information piece Bp3n is expressed by the intensity |Sb(n)|.

According to the above-described processing, the image reading apparatus 101 can generate 3z picture element information pieces Ip1 . . . Ip3z by using 3z+6 light receiving portions 32 arranged in a row. The number of picture element information pieces is larger than the number of the light receiving portions 32r aligned in the primary scanning direction x.

The transferer 600 is provided by combining a plurality of drive rollers and controlled by the controller 700. The controller 700 moves the read object 800 by a predetermined feeding width every time the contact image sensor 201 performs scanning along the primary scanning direction x. For instance, the feeding width of the read object 800 equals to the pitch of the light receiving portions 32.

The advantages of the sensor IC 301, the contact image sensor 201 and the image reading apparatus 101 are described below.

The light receiving portions 32 of the sensor IC 301 of this embodiment include light receiving portions 32r, 32g and 32b for receiving red light, green light and blue light. Thus, the contact image sensor 201 reads three colors at the same time by a single scanning operation.

The light receiving portions 32 of the sensor IC 301 of this embodiment are made up of light receiving portions 32r, 32g, 32b that emit light of different colors. For instance, the intensities of green light and blue light at the position where the light receiving portion 32r is provided cannot be determined. Thus, the signal processor 400 calculates the intensity of the green light at the light receiving portion 32r by using e.g. signals from the light receiving portion 32g closest to the light receiving portion 32r and the light receiving portion 32g next closest to the light receiving portion 32r. By this processing, the image reading apparatus 101 generates 3z picture element information pieces Ip1 . . . Ip3z by using electric signals from 3z+6 light receiving portions 32. According to a conventional technique, to obtain 3z picture element information pieces, three light-receiving-element rows each consisting of 3z light receiving portions need to be arranged. In the sensor IC 301 of this embodiment, the number of the light receiving portions 32 is considerably reduced and the light receiving portions can be arranged in a single row.

The light receiving portions 32 of the sensor IC 301 of this embodiment are arranged in a single row so that the width in the secondary scanning direction y is reduced to the minimum. Thus, the light source 22 of the contact image sensor 201 only needs to uniformly illuminate a relatively narrow read region 801. Thus, the requirements of the light source are reduced, which leads to reduction of the manufacturing cost. Further, since the lens array 24 only needs to pass a relatively narrow beam of light, influence by a difference in index of refraction depending on the distance from the optical axis is relatively small. Thus, the image reading apparatus 101 of this embodiment can enhance accuracy of reading.

The sensor IC 301 of this embodiment includes three output terminals 361, 362 and 363 and signals from the control circuit 35 are divided and outputted from the output terminals 361, 362 and 363 at the same time. Thus, in the image reading apparatus 101, the time taken for communication between the sensor IC 301 and the signal processor 400 is relatively short, which shortens the time taken for outputting an image after the scanning.

FIGS. 6-27 show other embodiments of the present invention. In these figures, the elements that are identical or similar to those of the foregoing embodiment are designated by the same reference signs as those used for the foregoing embodiment.

FIGS. 6-10 are for describing an image reading apparatus according to a second embodiment of the present invention. The image reading apparatus 102 shown in FIGS. 6-10 is configured to receive not only visible light but also light outside the visible light range. Other structures are the same as those of the image reading apparatus 101. Only the differences of the image reading apparatus 102 from the image reading apparatus 101 are described below.

Figure 7:
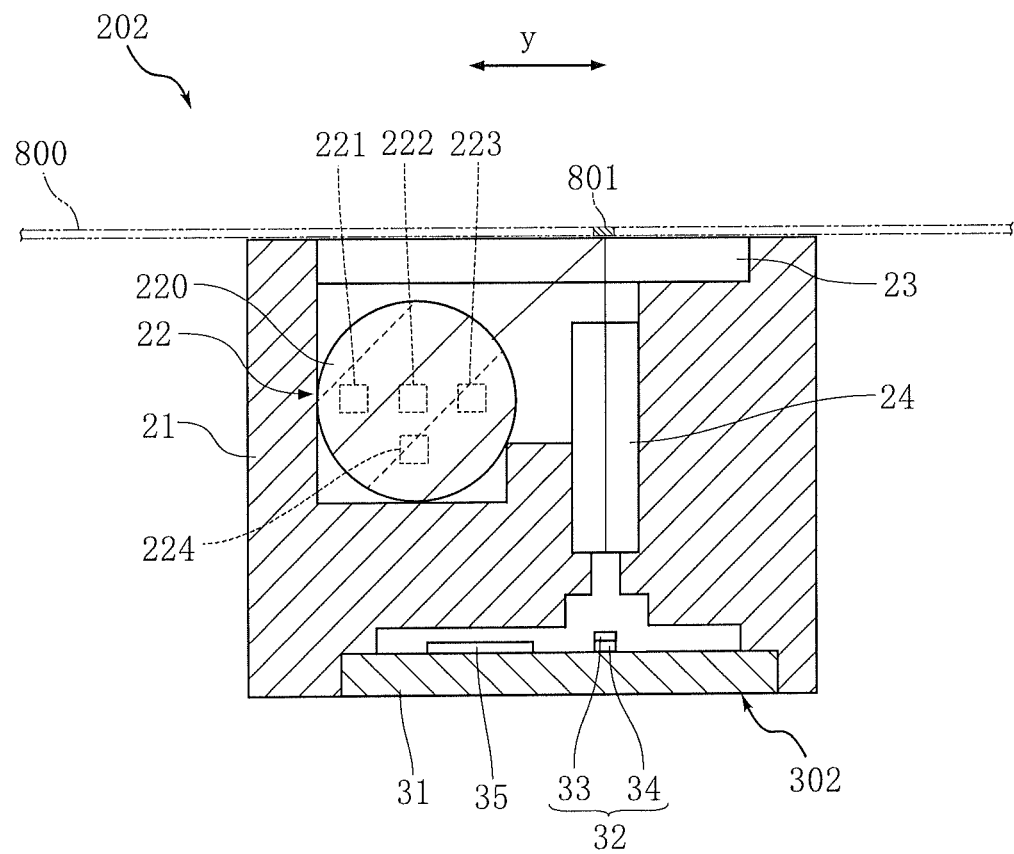
FIG. 7 is a schematic sectional view of the contact image sensor shown in FIG. 6.
Figure 8:
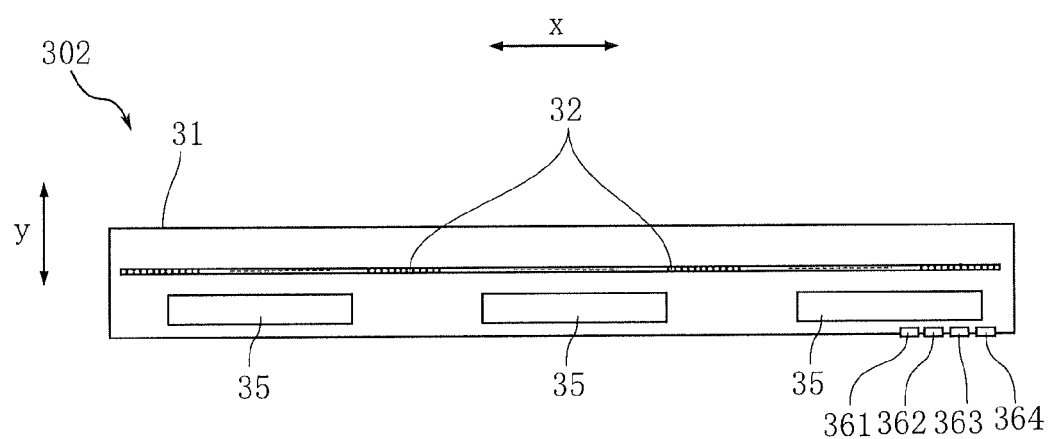
FIG. 8 is a schematic plan view of the sensor IC shown in FIG. 6.

The image reading apparatus 102 includes a contact image sensor 202 instead of the contact image sensor 201. As shown in FIG. 7, the contact image sensor 202 includes a sensor IC 302 instead of the sensor IC 301. The light source 22 of the contact image sensor 202 includes an infrared light LED chip 224 that emits infrared light. The light guide member 220 of this embodiment also causes apart of the infrared light emitted from the infrared LED chip 224 to travel toward the read region 801 while guiding the light in the primary scanning direction x. As shown in FIG. 8, the sensor IC 302 of this embodiment includes an output terminal 364 in addition to the output terminals 361, 362 and 363.

The light receiving portions 32 of the sensor IC 302 include z+2 light receiving portions 32ir for receiving infrared light emitted from the infrared light LED chip 224. Each of the light receiving portions 32ir includes a color filter 33ir that passes infrared light and a photo-electric conversion element 34ir that receives infrared light passing through the color filter 33ir. Though indicated by different reference signs for convenience, the photo-electric conversion elements 34ir may be f photo-electric conversion elements of the same type as those of the photo-electric conversion elements 34r, 34g and 34b.

Figure 9:
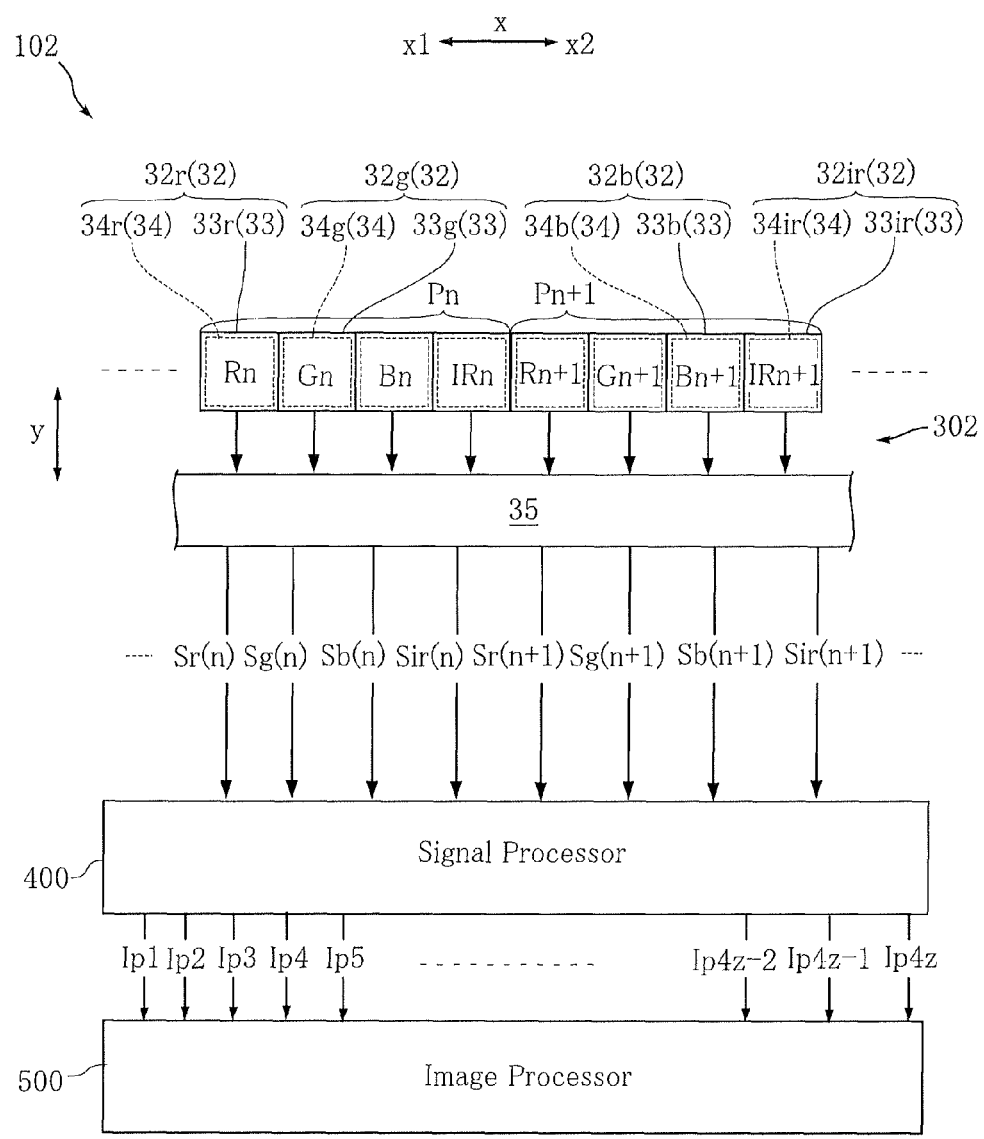
FIG. 9 is a view for describing the structure of the image reading apparatus shown in FIG. 6.

The light receiving portions expressed as IRn and IRn+1 in FIG. 9 are the light receiving portions 32ir. As shown in FIG. 9, each of the light receiving portions 32ir is arranged next to a light receiving portion 32b. In the sensor IC 302 of this embodiment, a plurality of groups each consisting of four light receiving portions 32r, 32g, 32b, 32ir are successively arranged.

The control circuit 35 of this embodiment amplifies electric signals from the light receiving portions 32ir and outputs electric signals Sir(0) . . . . Sir(z+1). The output terminal 364 outputs these electric signals Sir(0) . . . . Sir(z+1) to the signal processor 400. Although the electric signals Sir(n) and Sir(n+1) are shown side by side in FIG. 9 for convenience of description, the electric signals Sir(0) . . . Sir(z+1) are successively transmitted from the output terminal 364 to the signal processor 400 in numerical order. Electric signals Sir(0) . . . Sir(z+1) outputted from the output terminal 364 are collectively expressed as electric signal SIR.

The signal processor 400 of this embodiment uses 4z+8 electric signals SR, SG, SB and SIR to generate 4z picture element information pieces Ip1 . . . Ip4z. The picture element information piece Ipn includes a red color information piece Rpn, a green color information piece Gpn, a blue color information piece Bpn and an infrared information piece IRpn. The infrared information pieces IRp1 . . . IRpz are obtained by using the intensities |Sir(0)| . . . |Sir(z+1)| of the electric signals Sir(0) . . . Sir(z+1).

Figure 10:
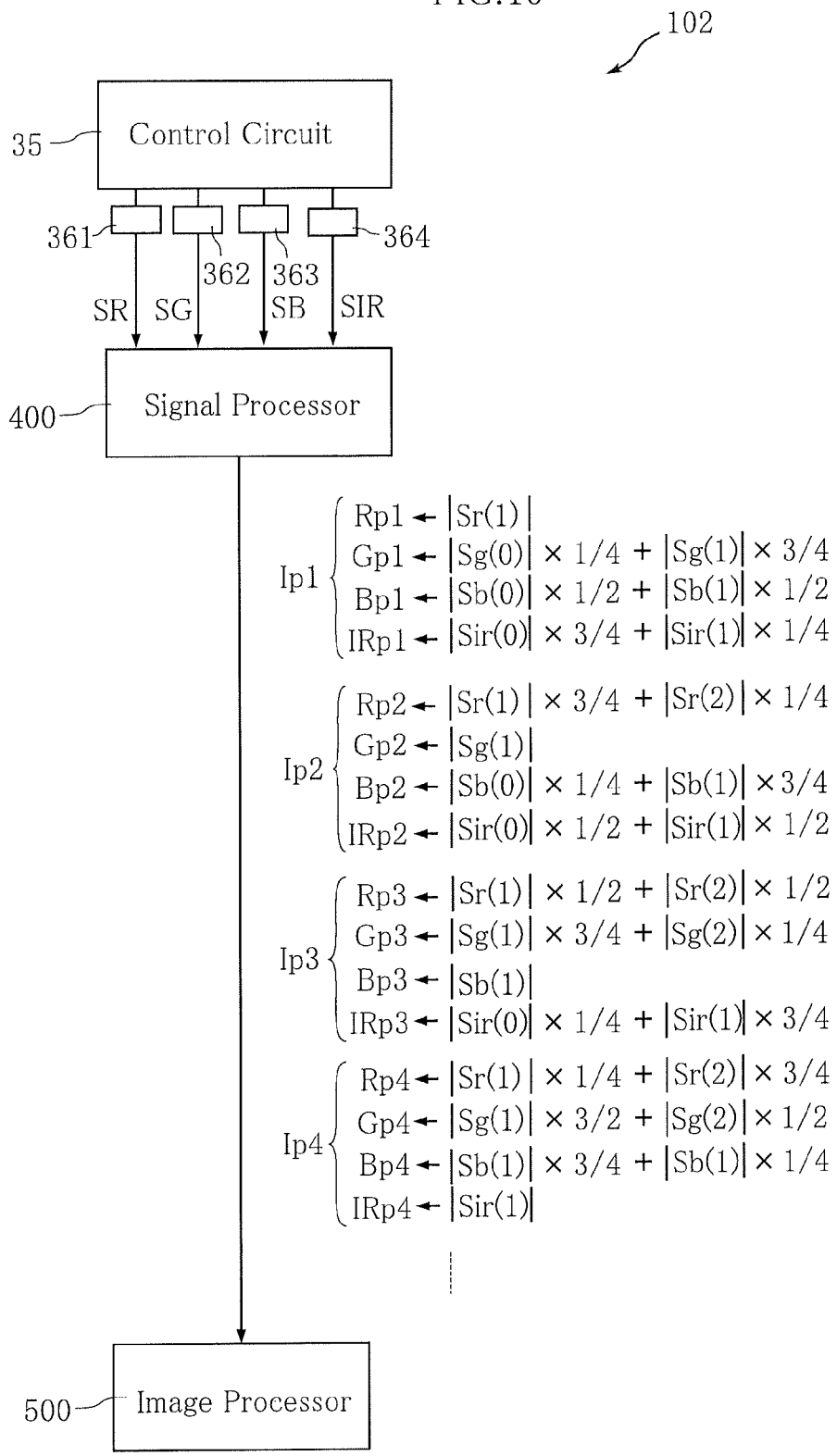
FIG. 10 is a view for describing the operation of the image reading apparatus shown in FIG. 7.

As shown in FIG. 9, the signal processor 400 performs processing by dividing the light receiving portions 32 into light receiving groups P(0) . . . P(n), P(n+1) . . . P(z+1) each consisting of four light receiving portions 32r, 32g, 32b, 32ir. The signal processor 400 uses electric signals from a plurality of light receiving groups to generate an infrared information piece IRpn corresponding to a position where a light receiving portion 32ir is not provided. FIG. 10 shows an example of generation of picture element information pieces Ip1 . . . Ip4.

The red color information piece Rp1 of the picture element information piece Ip1 is expressed by |Sr(1)|. The green color information piece Gp1 is expressed by |Sg(0)|×¼+|Sg(1)|×¾. The blue color information piece Bp1 is expressed by |Sb(0)|×½+|Sb(1)|×½. The infrared information piece IRp1 is expressed by |Sir(0)|×¾+|Sir(1)|×¼.

The picture element information piece Ip1 is the information on a portion of the read region 801 which corresponds to the light receiving portion 32r expressed as R1 (see FIG. 4). Since the light receiving portion 32r does not receive green light, blue light and infrared light, the green color information piece Gp1, the blue color information piece Bp1 and the infrared information piece IRp1 are unknown. The signal processor 400 performs complementing processing by using the above-described formulae to generate the green color information piece Gp1, the blue color information piece Bp1 and the infrared information piece IRp1.

In the image reading apparatus 102 of this embodiment, picture element information is generated which includes not only information on red light, green light and blue light but also information on infrared light. According to the conventional method, a light-receiving-element row for receiving infrared light may be added. In the sensor IC 102 of this embodiment, light receiving portions 32ir for receiving infrared light are included in the row of the light receiving portions 32.

Figure 11:
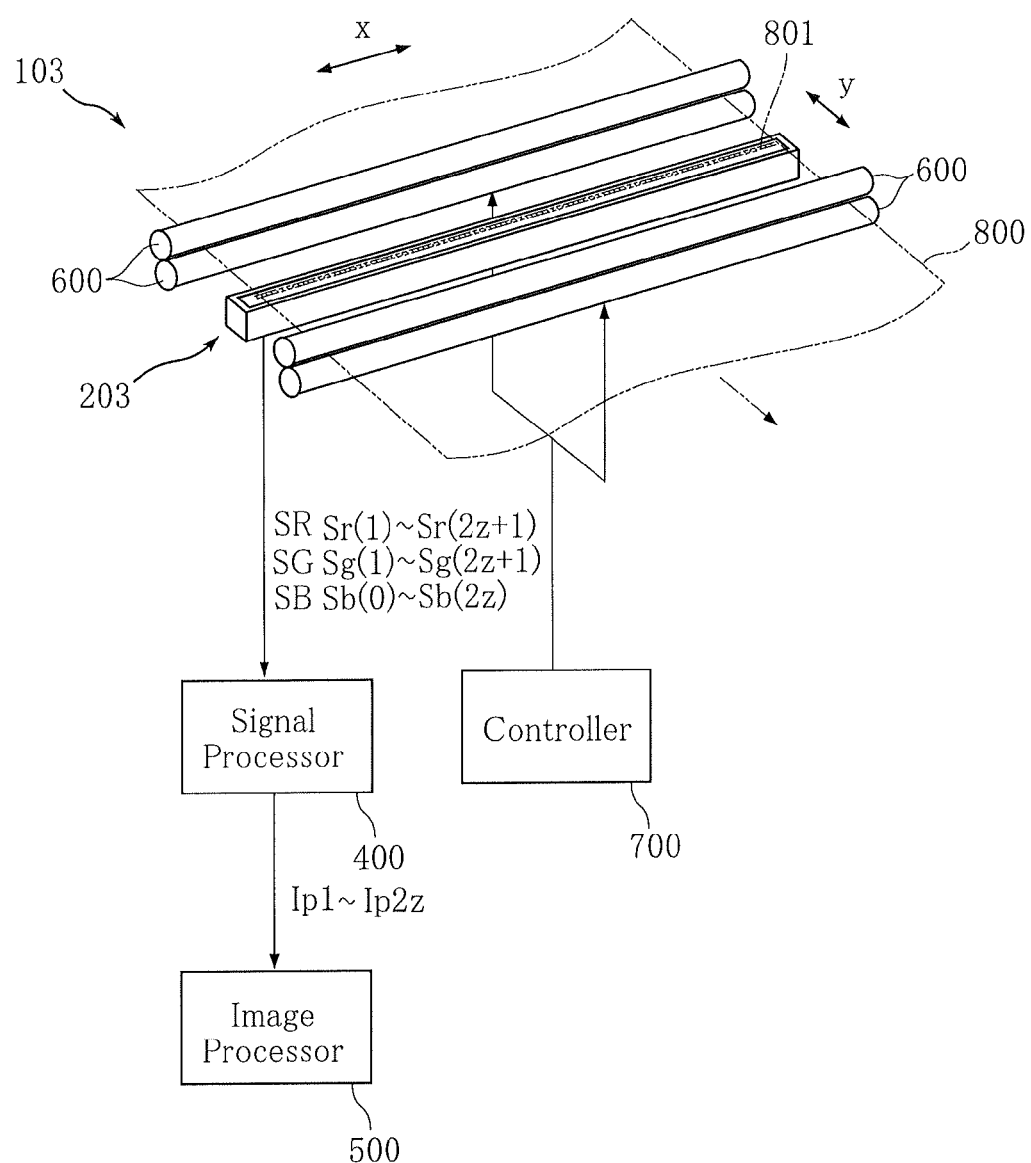
FIG. 11 is a schematic structural view showing an image reading apparatus according to a third embodiment of the present invention.
Figure 12:
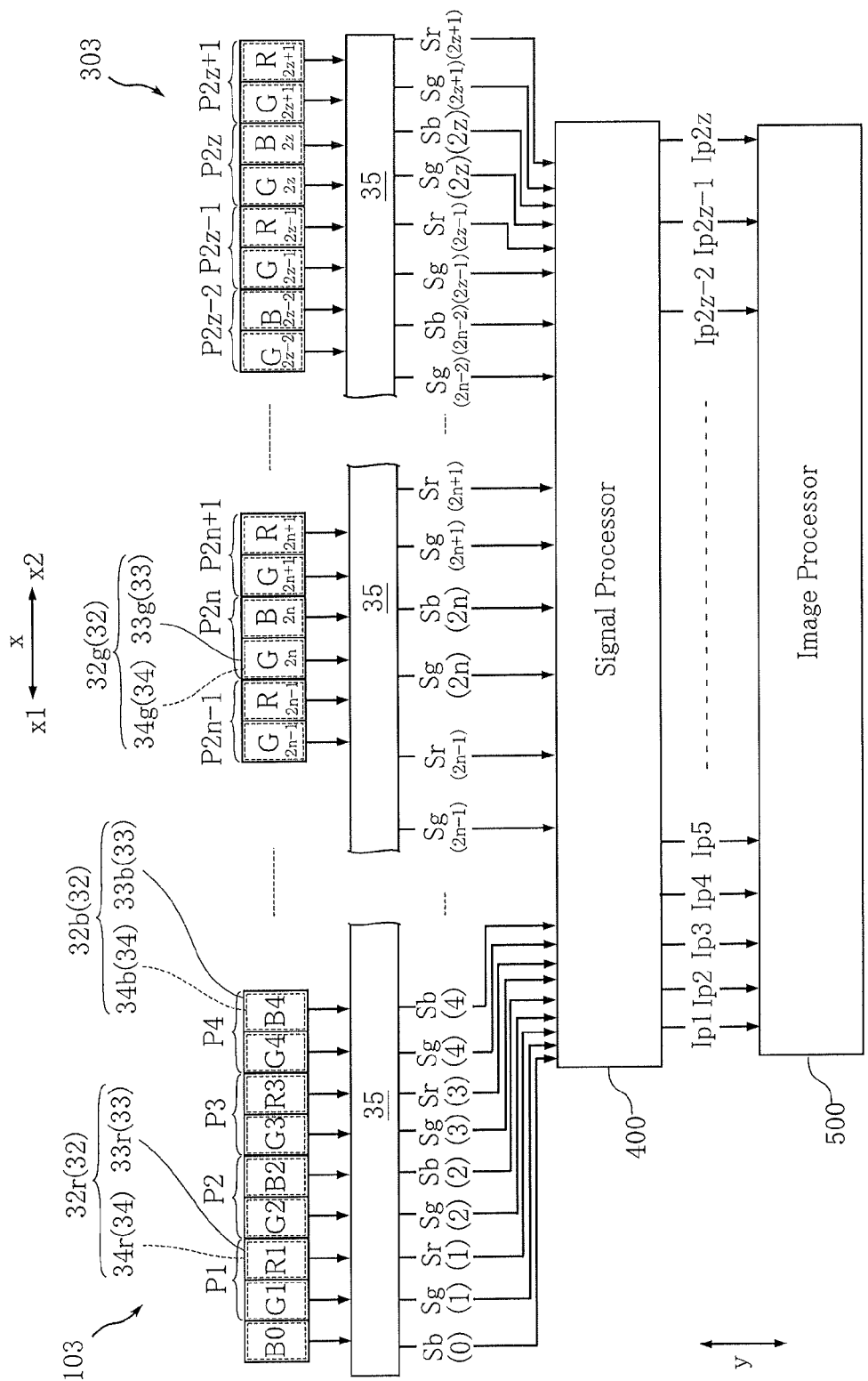
FIG. 12 is a view for describing the structure of the image reading apparatus shown in FIG. 11.
Figure 13:
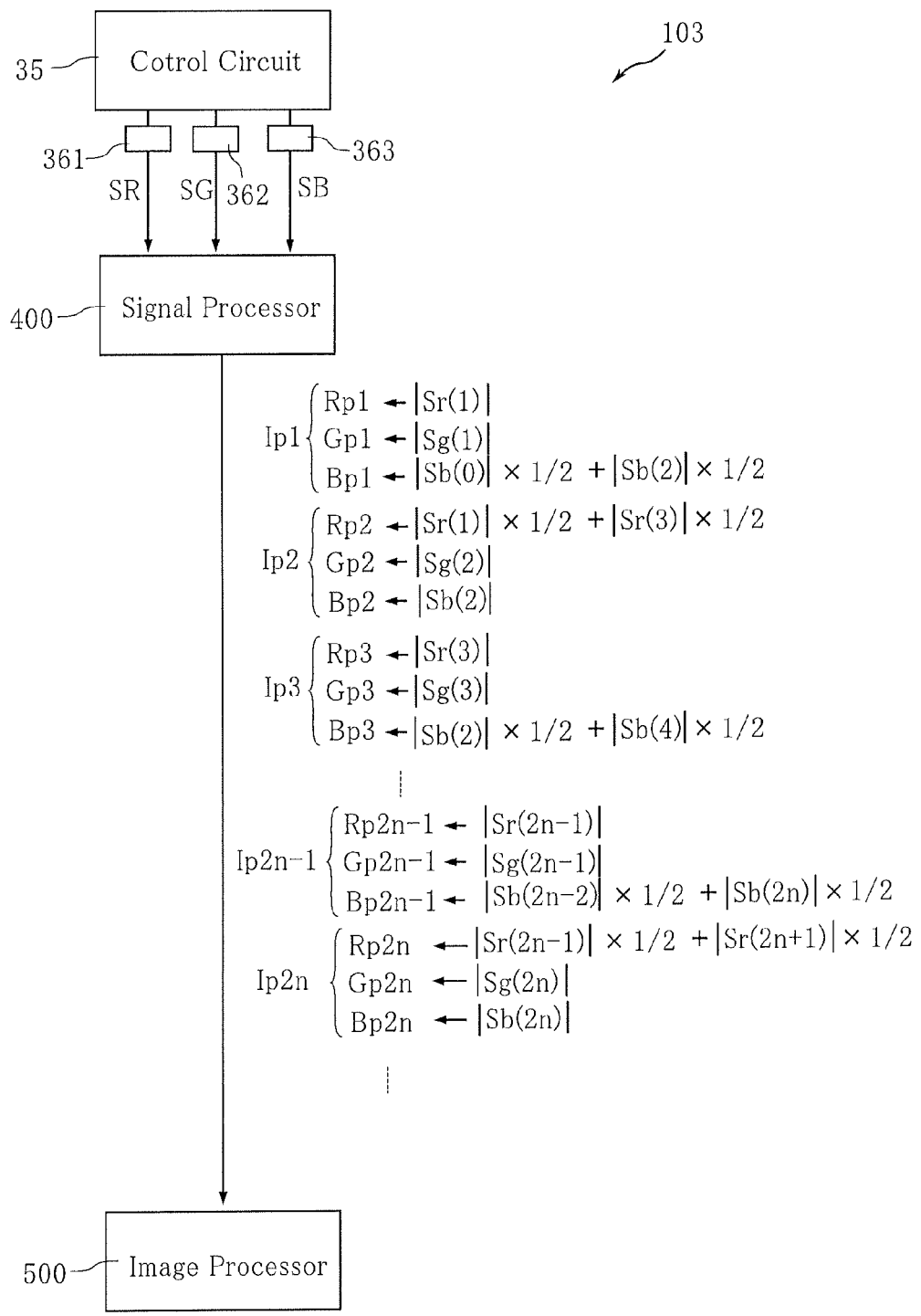
FIG. 13 is a view for describing the operation of the image reading apparatus shown in FIG. 11.
Figure 14:
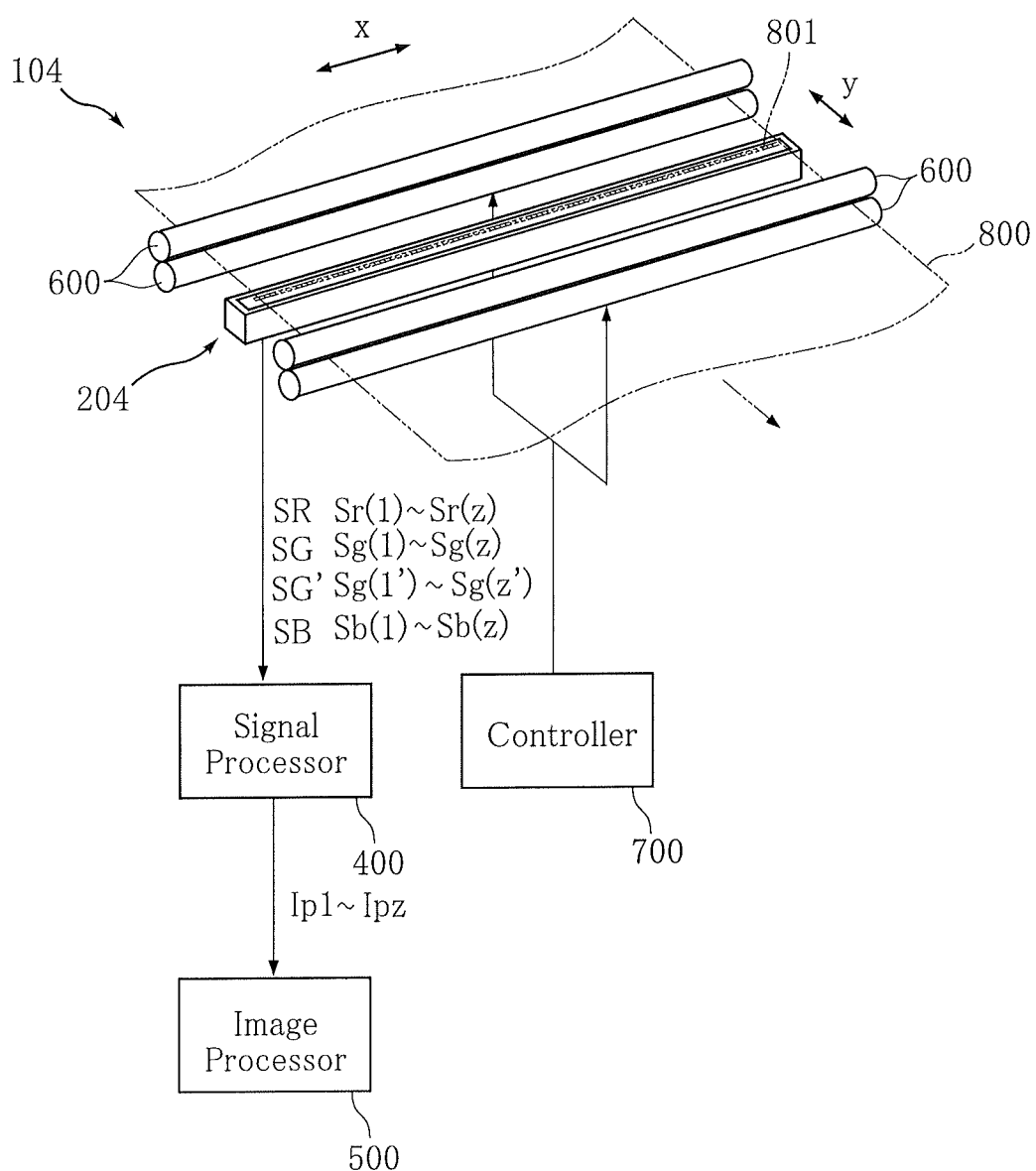
FIG. 14 is a schematic structural view showing an image reading apparatus according to a fourth embodiment of the present invention.

FIGS. 11-13 are views for describing an image reading apparatus according to a third embodiment of the present invention. The image reading apparatus 103 shown in FIGS. 11-13 includes a contact image sensor 203 instead of the contact image sensor 201. Other structures are the same as those of the image reading apparatus 101. The contact image sensor 203 includes a sensor IC 303 instead of the sensor IC 301. Other structures are the same as those of the contact image sensor 201.

The sensor IC 303 differs from the sensor IC 301 in structure of the light receiving portions 32. In this embodiment, the width of each light receiving portion 32 in the secondary scanning direction y is set to be twice the arrangement pitch of the light receiving portions 32.

In this embodiment, 4z+3 light receiving portions 32 are provided. The light receiving portions 32 include z+1 light receiving portions 32*r*, 2z+1 light receiving portions 32*g* and z+1 light receiving portions 32*b*. In FIG. 12, the light receiving portions 32*r* are expressed as R1, R3, R5 . . . R2n−1, R2n+1 . . . R2 z−1, R2 z+1 from the x1 side (left side in the figure) in the primary scanning direction x. Similarly, the light receiving portions 32*g* are expressed as G1, G2, G3, G4 . . . G2n−1, G2n, G2n+1 . . . G2z−2, G2z−1, G2z, G2z+1. Similarly, the light receiving portions 32*b* are expressed as B0, B2, B4 . . . B2n . . . B2z−2, B2z.

As shown in FIG. 12, a light receiving portion 32*b* (expressed as B0) is disposed at the end on the x1 side (left side in the figure) of the row of the light receiving portions 32 in the primary scanning direction x. Next to this light receiving portion 32*b* is disposed a light receiving portion 32*g* (expressed as G1), and next to it is disposed a light receiving portion 32*r* (expressed as R1). Next to this light receiving portion 32*r* is disposed a light receiving portion 32*g* (expressed as G2), and next to it is arranged a light receiving portion 32*b* (expressed as B2). Subsequently, a group consisting of a light receiving portion 32*g* and a light receiving portion 32*r* and a group consisting of a light receiving portion 32*g* and a light receiving portion 32*b* are alternately arranged. A group consisting of a light receiving portion 32*g* (expressed as G2z+1) and a light receiving portion 32*r* (expressed as R2z+1) is disposed at the end on the x2 side (right side in the figure) of the row of the light receiving portions 32 in the primary scanning direction x.

The control circuit 35 of this embodiment amplifies electric signals from the light receiving portions 32*r* expressed as R1 . . . R2z+1 in FIG. 12 to output z+1 electric signals Sr(1) . . . Sr(2z+1). Each of the electric signals Sr(1) . . . Sr(2z+1) is based on the electric signal from the same-numbered, corresponding one of R1 . . . R2z+1.

The control circuit 35 of this embodiment amplifies electric signals from the light receiving portions 32*g* expressed as G1 . . . G2z+1 in FIG. 12 to output 2z+1 electric signals Sg(1) . . . Sg(2z+1). Each of the electric signals Sg(1) . . . Sg(2z+1) is based on the electric signal from the same-numbered, corresponding one of G1 . . . G2z+1.

The control circuit 35 of this embodiment amplifies electric signals from the light receiving portions 32*b* expressed as B0 . . . B2z in FIG. 12 to output z+1 electric signals Sb(0) . . . Sb(2z). Each of the electric signals Sb(0) . . . Sb(2z) is based on the electric signal from the same-numbered, corresponding one of B0 . . . B2z.

As shown in FIGS. 12 and 13, the signal processor 400 of this embodiment generates 2z picture element information pieces Ip1 . . . Ip2z from the electric signals SR, SG and SB. As shown in FIG. 12, the signal processor 400 of this embodiment performs processing by dividing the light receiving portions 32 excluding the one expressed as B0 into light receiving groups P1 . . . P2z+1 each consisting of two light receiving portions 32. Of the light receiving groups P1 . . . P2z+1, each of the groups with odd numbers consists of a light receiving portion 32*g* and a light receiving portion 32*r*. Of the light receiving groups P1 . . . P2z+1, each of the groups with even numbers consists of a light receiving portion 32*g* and a light receiving portion 32*b*. Specifically, a light receiving group P2n−1 consists of a light receiving portion 32*g* (expressed as G2n−1) and a light receiving portion 32*r* (expressed as R2n−1), whereas a light receiving groups P2n consists of a light receiving portion 32*g* (expressed as G2n) and a light receiving portion 32*b* (expressed as B2n).

Each of the picture element information pieces Ip1 . . . Ip2z generated by the signal processor 400 of this embodiment is related to one of the light receiving groups P1 . . . P2z which has the same number. For instance, the picture element information piece Ip1 is the information on a portion of the light receiving region 801 which faces the light receiving portion 32*g* (expressed as G1) and the light receiving portion 32*r* (expressed as R1) which constitute the light receiving group P1. The picture element information piece Ip2 is the information on a portion of the read region 801 which faces the light receiving portion 32*g* (expressed as G2) and the light receiving portion 32*b* (expressed as B2) which constitute the light receiving group P2. In this way, a picture element information piece Ip2n−1 is the information on a portion which faces a light receiving portion 32*g* (expressed as G2n−1) and a light receiving portion 32*r* (expressed as R2n−1) which constitute a light receiving group P2n−1. A picture element information piece Ip2n is the information on a portion of the light receiving region 801 which faces a light receiving portion 32*g* (expressed as G2n) and a light receiving portion 32*b* (expressed as B2n) which constitute a light receiving group P2n.

A light receiving groups P2n−1, including the light receiving group P1, does not include a light receiving portion 32*b*. Thus, the blue color information piece Bp2n−1 of the picture element information piece Ip2n−1 is unknown. A light receiving group P2n, including the light receiving group P2, does not include a light receiving portion 32*r*. Thus, the red color information piece Rp2n of the picture element information piece Ip2n is unknown. The signal processor 400 of this embodiment performs the complementing processing described later to obtain the blue color information piece Bp2n−1 and the red color information piece Rp2n.

In this embodiment, the red color information piece Rp1 of the picture element information piece Ip1 is expressed by |Sr(1)|, and the green color information piece Gp1 is expressed by |Sg(1)|. The blue color information piece Bp1 of the picture element information piece Ip1 is expressed by |Sb(0)|×½+|Sb(2)|×½.

The blue color information piece Bp1 of this embodiment is obtained by averaging the electric signal Sb(0) from the light receiving portion 32*b* (expressed as B0 in FIG. 12) closest to the light receiving portion 32*g* expressed as G1 in FIG. 12 and the electric signal Sb(2) from the light receiving portion 32*b* (expressed as G2 in FIG. 12) next closest to that light receiving portion 32*g*.

The red color information piece Rp2 of the picture element information piece Ip2 of this embodiment is expressed by |Sr(1)|×½+|Sr(3)|×½. The green color information piece Gp2 is expressed by |Sg(2)|, and the blue color information piece Bp2 is expressed by |Sb(2)|.

The red color information piece Rp2 of this embodiment is obtained by averaging the electric signal Sr(1) from the light receiving portion 32*r* (expressed as R1 in FIG. 12) closest to the light receiving portion 32*g* expressed as G2 in FIG. 12 and the electric signal Sr(3) from the light receiving portion 32*r* (expressed as R3 in FIG. 12) next closest to that light receiving portion 32*g*.

Similarly, the red color information piece Rp2n−1 of the picture element information piece Ip2n−1 of this embodiment is expressed by |Sr(2n−1)|, and the green color information piece Gp1 is expressed by |Sg(2n−1)|. The blue color information piece Bp2n−1 of the picture element information piece Ip2n−1 is expressed by |Sb(2n−2)|×½+|Sb(2n)|×½.

The red color information piece Rp2n of the picture element information piece Ip2n of this embodiment is expressed by |Sr(2n−1)|×½+|Sr(2n+1)|×½. The green color information piece Gp2n is expressed by |Sg(2n)|, and the blue color information piece Bp2n is expressed by |Sb(2n)|.

The controller 700 of this embodiment moves the read object 800 by a feeding width corresponding to the width of each light receiving portion 32 in the secondary scanning direction y every time the contact image sensor 203 performs the scanning operation. In this embodiment, the width of each light receiving portion 32 in the secondary scanning direction y is set to be twice the arrangement pitch of the light receiving portions 32 in the primary scanning direction x. Accordingly, the feeding width of the read object 800 is twice the arrangement pitch of the light receiving portions 32.

In this embodiment again, three colors of red, green and blue are read simultaneously by using the light receiving portions 32 arranged in a row.

FIGS. 14-17 are for describing an image reading apparatus according to a fourth embodiment of the present invention. The image reading apparatus 104 shown in FIGS. 14-17 includes a contact image sensor 204 instead of the contact image sensor 201. Other structures are the same as those of the image reading apparatus 101. The contact image sensor 204 includes a sensor IC 304 instead of the sensor IC 301. Other structures are the same as those of the contact image sensor 201.

Figure 15:
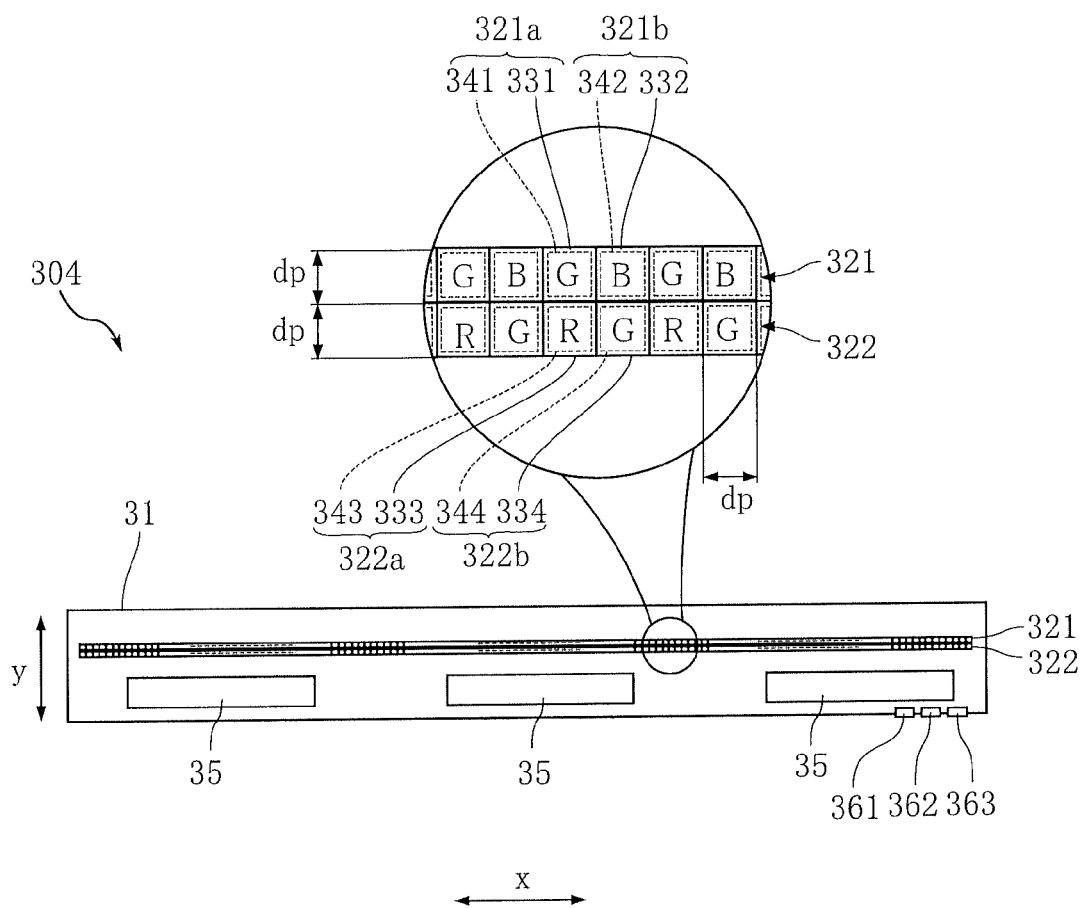
FIG. 15 is a schematic plan view of a sensor IC incorporated in the contact image sensor shown in FIG. 14.

As shown in FIG. 15, the sensor IC 304 of this embodiment includes a first light-receiving-element row 321 and a second light-receiving-element row 322 each consisting of a plurality of light receiving portions aligned in the primary scanning direction x. In this embodiment, each of the light receiving portions is square. In each of the first light-receiving-element row 321 and the second light-receiving-element row 322, the light receiving portions are arranged at a predetermined pitch dp. The second light-receiving-element row 322 is provided at a position deviated from the first light-receiving-element row 321 in the secondary scanning direction y by a distance corresponding to the pitch dp.

Specifically, the first light-receiving-element row 321 consists of a plurality of light receiving portions 321a that receive green light and a plurality of light receiving portions 321b that receive blue light. The second light-receiving-element row 322 consists of a plurality of light receiving portions 322a that receive red light and a plurality of light receiving portions 322b that receive green light. For convenience, in FIGS. 15 and 16, the light receiving portions 321a and the light receiving portions 322b are expressed as G, the light receiving portions 321b are expressed as B, and the light receiving portions 322a are expressed as R. In this embodiment and subsequent embodiments, green light correspond to the light of a first wavelength recited in the claims, and the light receiving portions 321a correspond to the first light receiving portion recited in the claims. Blue light corresponds to the light of a second wavelength recited in the claims, and the light receiving portions 321b correspond to the second light receiving portion recited in the claims. Red light corresponds to the light of a third wavelength recited in the claims, and the light receiving portions 322a correspond to the third light receiving portion recited in the claims.

Figure 16:
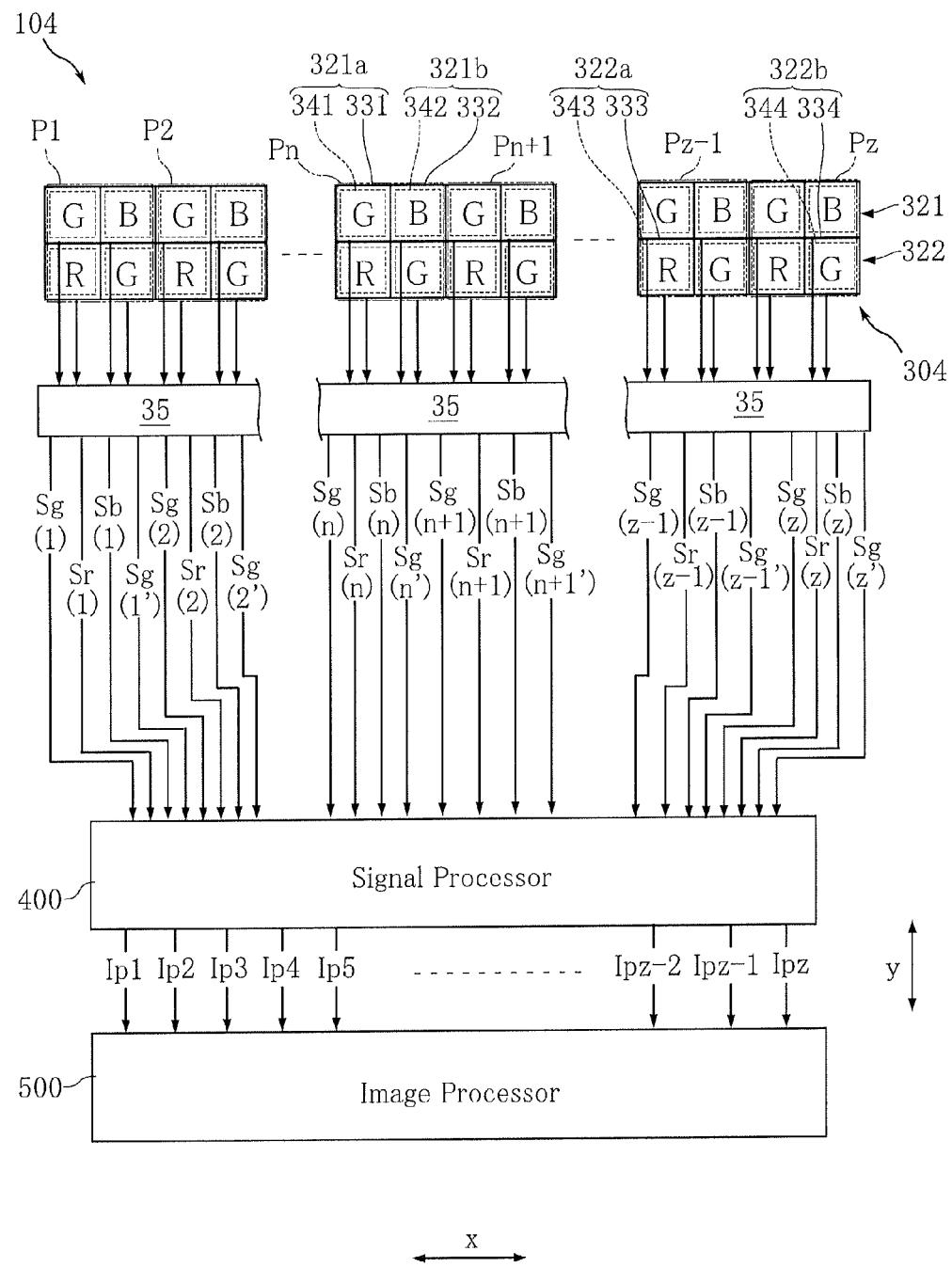
FIG. 16 is a view for describing the structure of the image reading apparatus shown in FIG. 14.

As shown in FIGS. 15 and 16, in the first light-receiving-element row 321, light receiving portions 321a and light receiving portions 321b are alternately arranged. In the second light-receiving-element row 322, light receiving portions 322a and light receiving portion 322b are alternately arranged. The position of each of the light receiving portions 322a in the primary scanning direction x is the same as that of a respective one of the light receiving portions 321a. The position of each of the light receiving portions 322b in the primary scanning direction x is the same as that of a respective one of the light receiving portions 321b. Hereinafter, for convenience of description, it is assumed that z light receiving portions 321a, z light receiving portions 321b, z light receiving portions 322a and z light receiving portions 322b are provided.

Each light receiving portion 321a of this embodiment includes a color filter 331 and a photo-electric conversion element 341. The color filter 331 has a structure similar to that of the color filter 33g of the sensor IC 301, and the photo-electric conversion element 341 has a structure similar to that of the photo-electric conversion element 34g of the sensor IC 301.

Each light receiving portion 321b of this embodiment includes a color filter 332 and a photo-electric conversion element 342. The color filter 332 has a structure similar to that of the color filter 33b of the sensor IC 301, and the photo-electric conversion element 342 has a structure similar to that of the photo-electric conversion element 34b of the sensor IC 301.

Each light receiving portion 322a of this embodiment includes a color filter 333 and a photo-electric conversion element 343. The color filter 333 has a structure similar to that of the color filter 33r of the sensor IC 301, and the photo-electric conversion element 343 has a structure similar to that of the photo-electric conversion element 34r of the sensor IC 301.

Each light receiving portion 322b of this embodiment includes a color filter 334 and a photo-electric conversion element 344. The color filter 334 has a structure similar to that of the color filter 33g of the sensor IC 301, and the photo-electric conversion element 344 has a structure similar to that of the photo-electric conversion element 34g of the sensor IC 301.

As shown in FIG. 16, the control circuit 35 of this embodiment amplifies electric signals from the light receiving portions 321a to output electric signals Sg(1) . . . Sg(z). Here, an electric signal Sg(1) . . . Sg(z) with a smaller number is based on a signal emitted from a light receiving portion 321a closer to the left end in FIG. 16 in the primary scanning direction x. Electric signals Sg(1) . . . Sg(z) of this embodiment corresponds to the first electric signal recited in the claims.

The control circuit 35 of this embodiment amplifies electric signals from the light receiving portions 321b to output electric signals Sb(1) . . . Sb(z). Here, an electric signal Sb(1) . . . Sb(z) with a smaller number is based on a signal emitted from a light receiving portion 321b closer to the left end in FIG. 16 in the primary scanning direction x. Electric signals Sg(b) . . . Sb(z) of this embodiment correspond to the second electric signal recited in the claims.

The control circuit 35 of this embodiment amplifies electric signals from the light receiving portions 322a to output electric signals Sr(1) . . . Sr(z). Here, an electric signal Sr(1) . . . Sr(z) with a smaller number is based on a signal emitted from a light receiving portion 322a closer to the left end in FIG. 16 in the primary scanning direction x. Electric signals Sr(1) . . . Sr(z) of this embodiment correspond to the third electric signal recited in the claims.

The control circuit 35 of this embodiment amplifies electric signals from the light receiving portions 322b to output electric signals Sg(1') . . . Sg(z'). Here, an electric signal Sg(1) . . . Sg(z') with a smaller number is based on a signal emitted from a light receiving portion 322b closer to the left end in FIG. 16 in the primary scanning direction x. Electric signal Sg(1') . . . Sg(z') of this embodiment corresponds to the fourth electric signal recited in the claims.

The output terminal 361 of this embodiment outputs electric signals Sg(0) . . . Sg(z) and electric signals Sg(0') . . .

Sg(z') outputted by the control circuit 35 to the signal processor 400. The output terminal 362 outputs electric signals Sb(0) . . . Sb(z) outputted by the control circuit 35 to the signal processor 400. The output terminal 363 outputs electric signals Sr(0) . . . Sr(z) outputted by the control circuit 35 to the signal processor 400. Hereinafter, electric signals Sg(0) . . . Sg(z) outputted from the output terminal 361 are collectively expressed as electric signal Sc, and electric signals Sg(0') . . . Sg(z') outputted from the output terminal 361 are collectively expressed as electric signal SG'. Electric signals Sb(0) . . . Sb(z) outputted from the output terminal 362 are collectively expressed as electric signal SB, and electric signals Sr(0) . . . Sr(z) outputted from the output terminal 363 are collectively expressed as electric signal SR.

The signal processor 400 of this embodiment receives electric signals SR, SG, SB and SG' outputted from the sensor IC 304, generates a plurality of picture element information pieces based on the received electric signals, and transmits the generated picture element information pieces to the image processor 500. Each of the picture element information pieces includes color information of three colors, red, green and blue. Based on the picture element information pieces, the image processor 500 forms a color read image of the read region 801.

The signal processor 400 of this embodiment performs processing by dividing the light receiving portions 321a, 321b, 322a and 322b into z light receiving groups P1 . . . Pz shown in FIG. 16. The light receiving groups P1 . . . Pz are successively arranged in numerical order in the primary scanning direction x. The signal processor 400 generates z picture element information pieces Ip1 . . . Ipz corresponding to the light receiving groups P1 . . . Pz, respectively.

Each of the light receiving groups P1 . . . Pz consists of a light receiving portion 321a, a light receiving portion 321b and a light receiving portion 322a adjacent to the light receiving portion 321a, and a light receiving portion 322b adjacent to the light receiving portion 321b.

Figure 17:
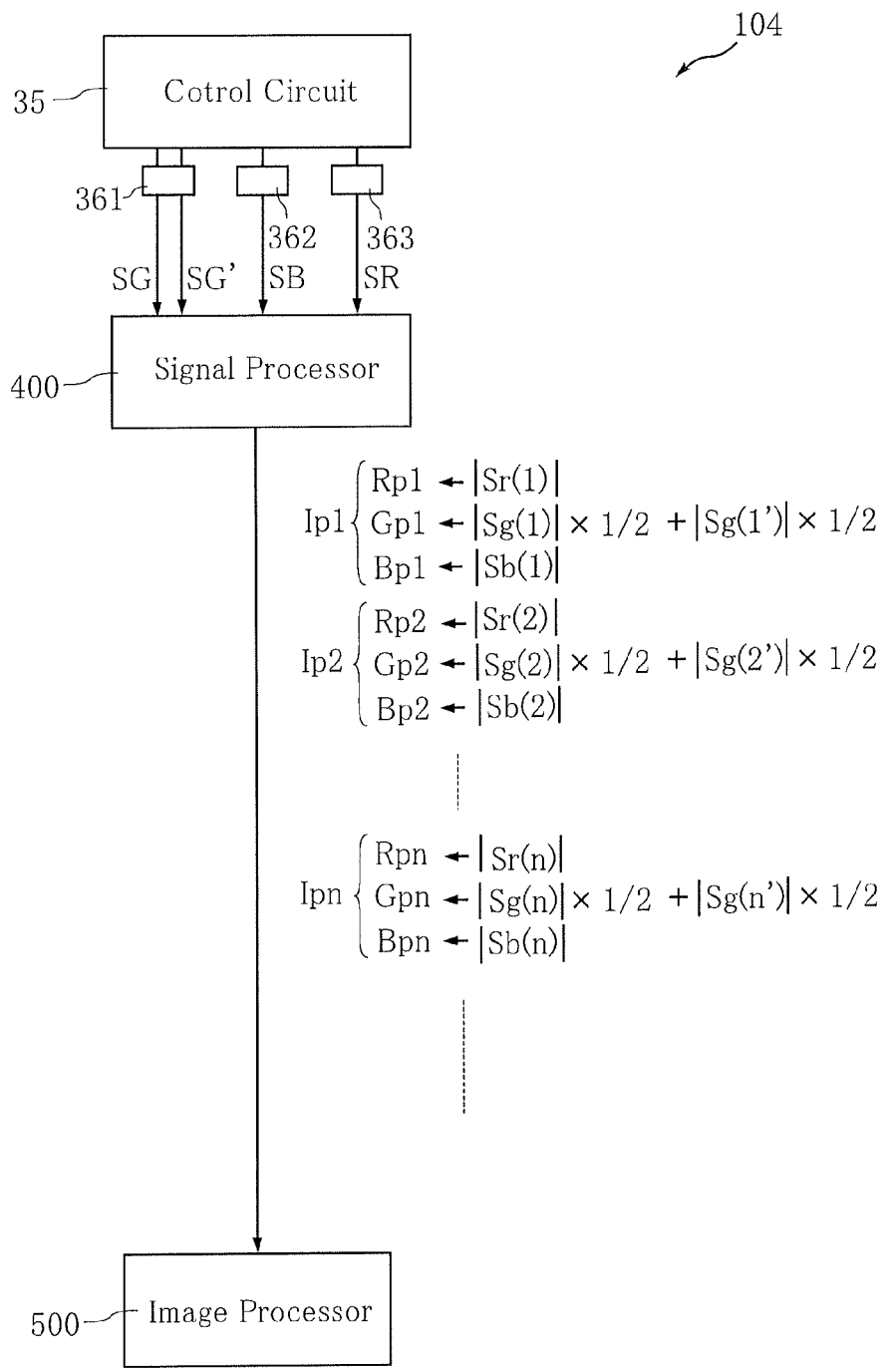
FIG. 17 is a view for describing the operation of the image reading apparatus shown in FIG. 14.

As shown in FIG. 17, each picture element information piece Ipn includes a red color information piece Rpn, a green color information piece Gpn and a blue color information piece Bpn, where n is an integer not smaller than 1 and not larger than z. The signal processor 400 generates a red color information piece Rpn based on an electric signal Sr(n) from the light receiving portion 322a included in the light receiving group Pn. For instance, the red color information piece Rpn is expressed by the intensity |Sr(n)| of the electric signal Sr(n).

The signal processor 400 generates a blue color information piece Bpn based on an electric signal Sb(n) from the light receiving portion 321b included in the light receiving group Pn. For instance, the blue color information piece Bpn is expressed by the intensity |Sb(n)| of the electric signal Sb(n).

The signal processor 400 generates a green color information piece Gpn based on electric signals Sr(n), Sg(n') from the light receiving portion 321a and the light receiving portion 322b included in the light receiving group Pn. For instance, the green color information piece Gpn is obtained by using the intensity |Sg(n)| of the electric signal Sg(n) and the intensity |Sg(n')| of the electric signal Sg(n') and expressed as $|Sg(n)| \times \frac{1}{2} + |Sg(n')| \times \frac{1}{2}$.

The controller 700 of this embodiment moves the read object 800 by a predetermined feeding width every time the contact image sensor 204 performs the scanning operation along the primary scanning direction x. In this embodiment, the feeding width of the read object 800 is twice the arrangement pitch dp of the light-receiving-element rows 321, 322. This feeding width equals to the total of the width of the light-receiving-element row 321 in the secondary scanning direction y and the width of the light-receiving-element row 322 in the secondary scanning direction y.

In the sensor IC 304 of this embodiment, three colors are read simultaneously by using two light-receiving-element rows 321 and 322. The width of the two light-receiving-element rows 321, 322 in the secondary scanning direction y can be shorter than the width of the rows in a conventional three-row type.

Figure 18:
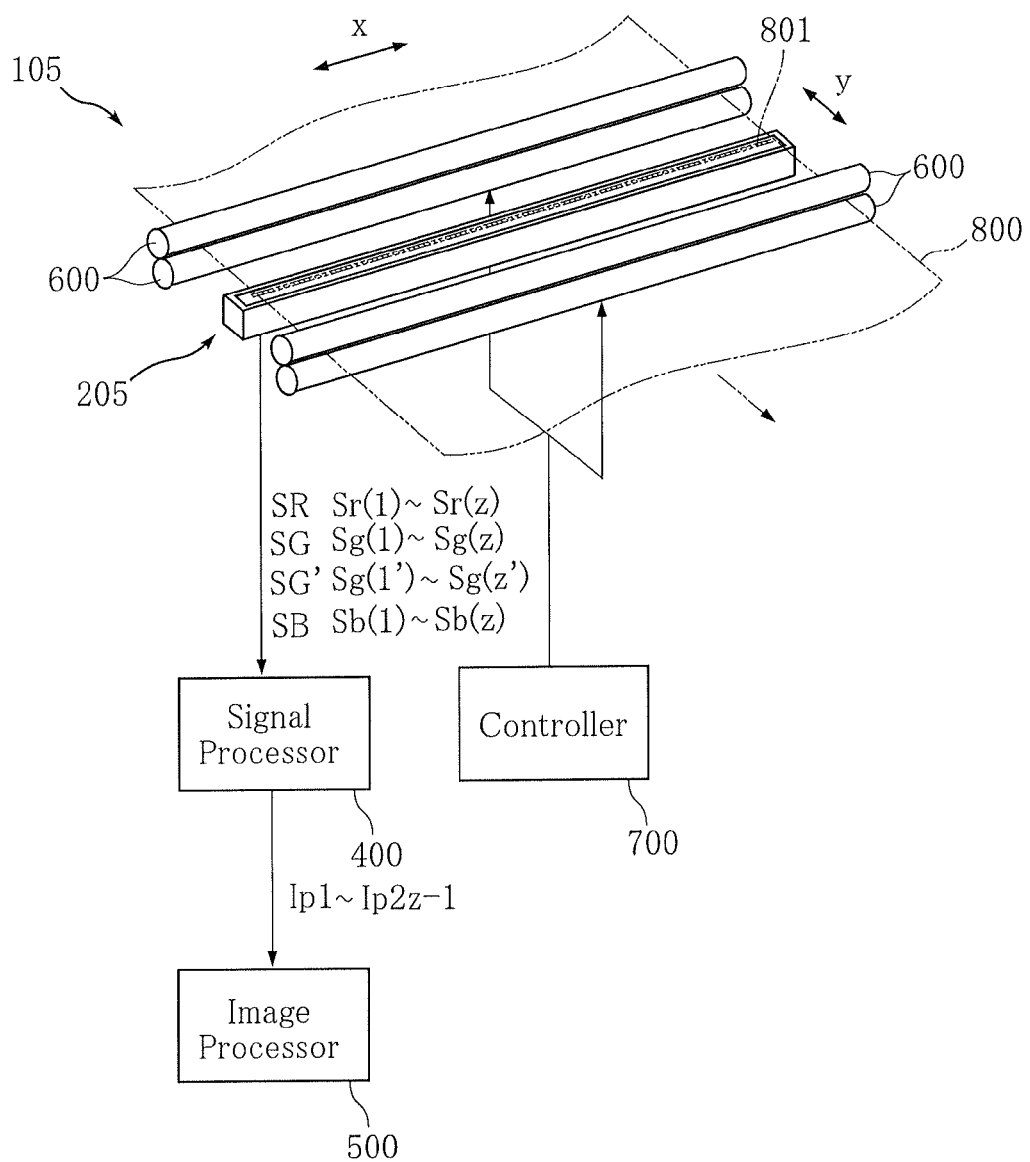
FIG. 18 is a schematic structural view showing an image reading apparatus according to a fifth embodiment of the present invention.
Figure 19:
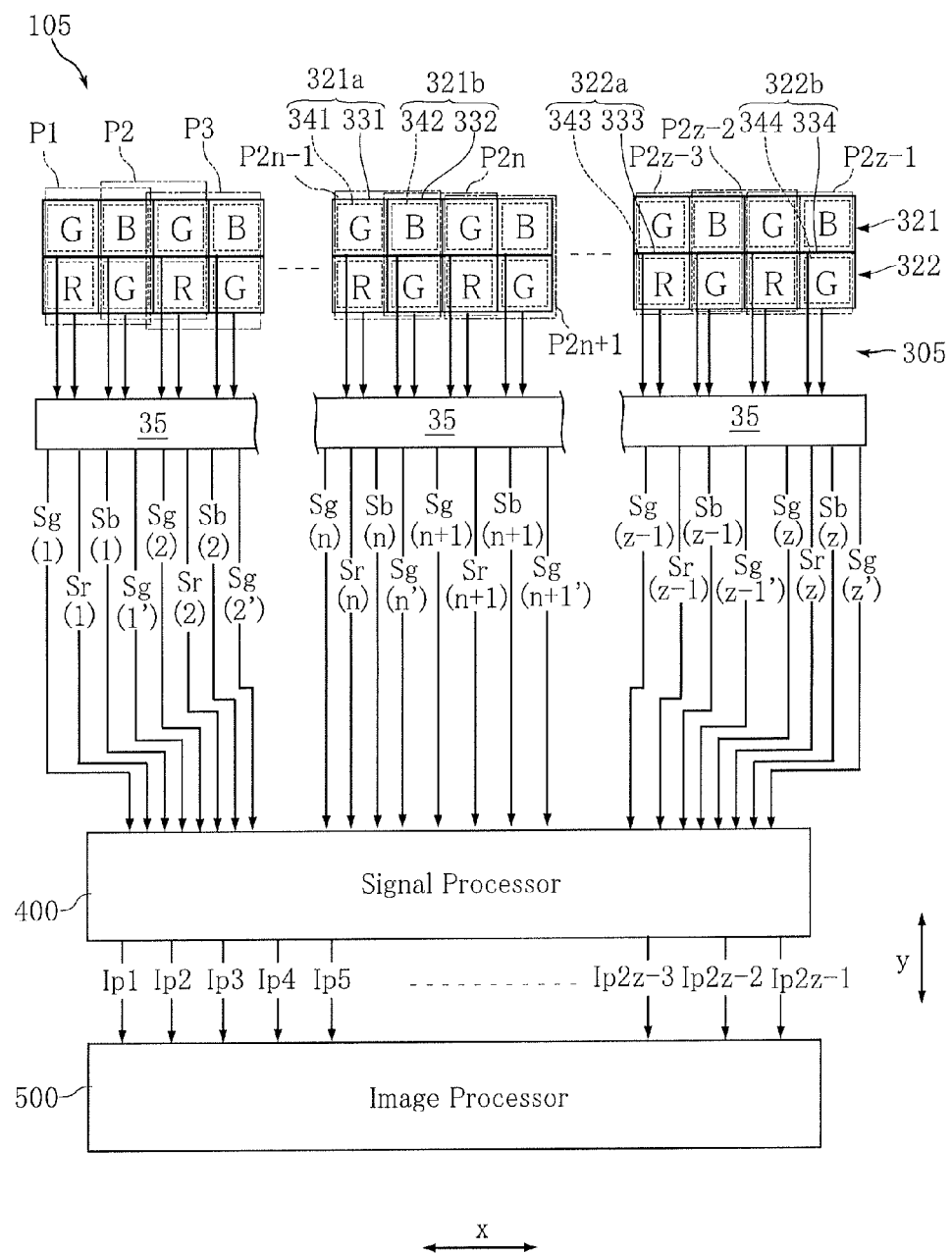
FIG. 19 is a view for describing the structure of the image reading apparatus shown in FIG. 18.
Figure 20:
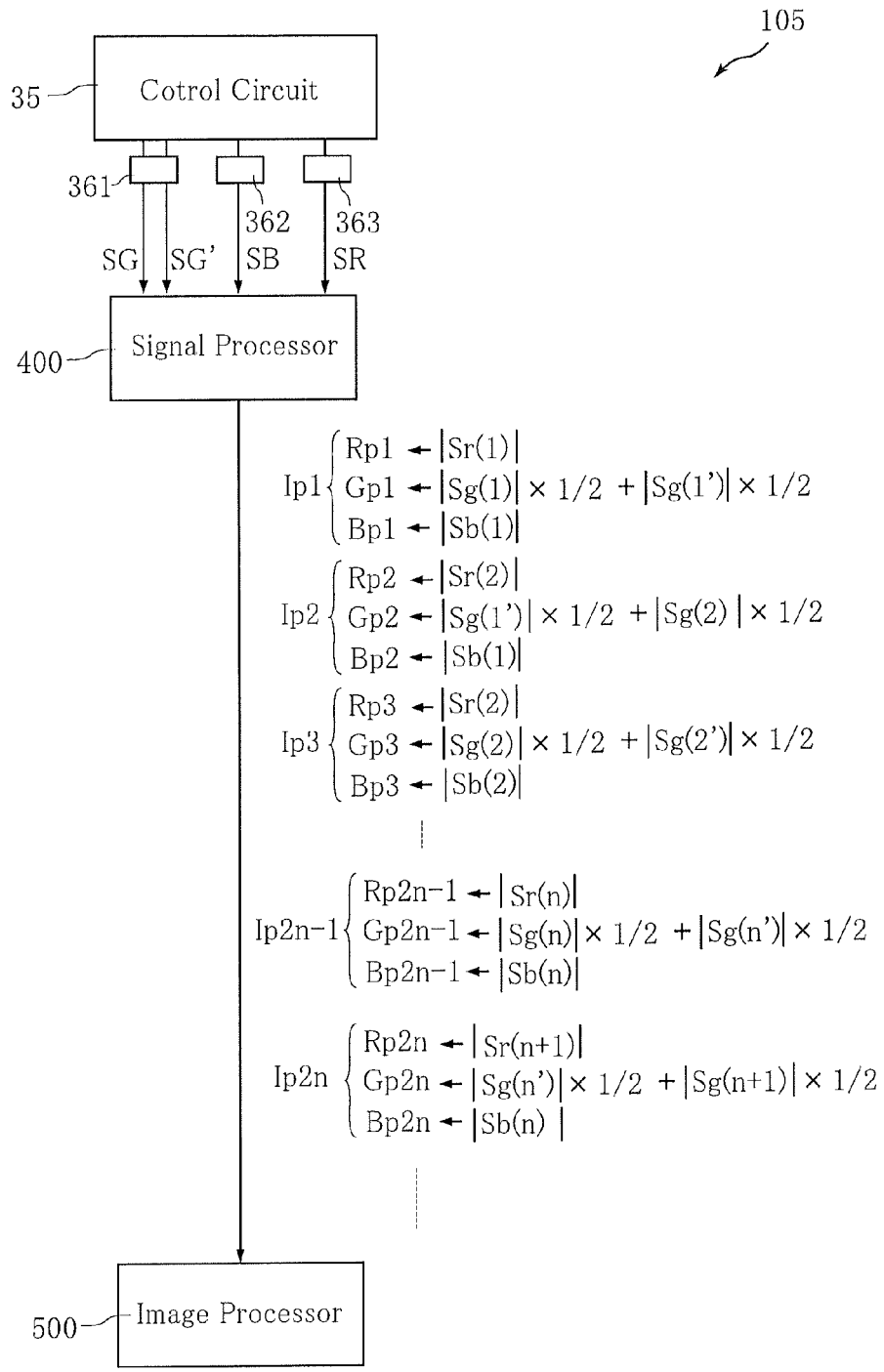
FIG. 20 is a view for describing the operation of the image reading apparatus shown in FIG. 18.
Figure 21:
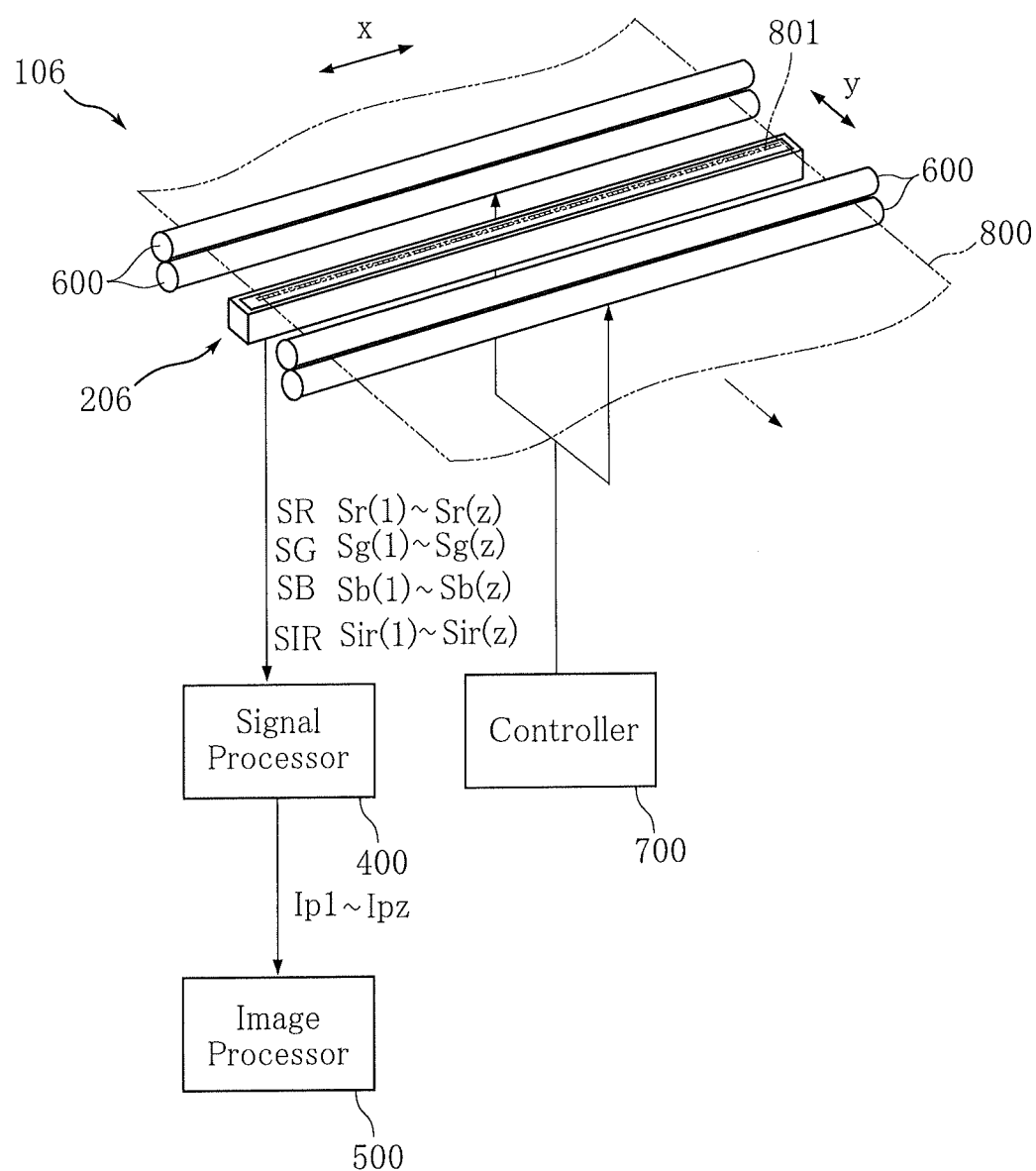
FIG. 21 is a schematic structural view showing an image reading apparatus according to a sixth embodiment of the present invention.

FIGS. 18-20 are for describing an image reading apparatus according to a fifth embodiment of the present invention. The image reading apparatus 105 shown in FIGS. 18-20 differs from the image reading apparatus 104 in the processing by the signal processor 400 and the control by the controller 700. The image reading apparatus 105 includes a contact image sensor 205 including a sensor IC 105. The sensor IC 105 has the same structure as that of the sensor IC 104, and the contact image sensor 205 has the same structure as that of the contact image sensor 204.

As shown in FIG. 19, the signal processor 400 of this embodiment defines 2z−1 light receiving groups P1 . . . P2z−1 with respect to 4z light receiving portions 321a, 321b, 322a, 322b and generates picture element information pieces Ip1 . . . Ip2z−1 corresponding to the light receiving groups P1 . . . P2z−1, respectively. The light receiving groups P1 . . . P2z−1 are aligned at a pitch dp in the primary scanning direction x. For instance, the light receiving portion 321b and the light receiving portion 322b included in the light receiving group P1 are included in the light receiving group P2 as well.

Correspondingly to the above-described processing, the controller 700 of this embodiment moves the read object 800 by a feeding width equal to the pitch dp every time the contact image sensor 205 performs the scanning operation along the primary scanning direction x.

As shown in FIG. 20, the picture element information piece Ip2n−1 corresponding to the light receiving group P2n−1 includes a red color information piece Rp2n−1, a blue color information piece Bp2n−1 and a green color information piece Gp2n−1, where n is an integer not smaller than 1 and not larger than z. The red color information piece Rp2n−1 is expressed by |Sr(n)|, the blue color information piece Bpn−1 is expressed by |Sb(n)|, and the green color information piece Gp2n−1 is expressed by $|Sg(n)| \times \frac{1}{2} + |Sg(n')| \times \frac{1}{2}$.

The picture element information piece Ip2n corresponding to the light receiving group P2n includes a red color information piece Rp2n, a blue color information piece Bp2n, and a green color information piece Gp2n. The red color information piece Rp2n is expressed by |Sr(n+1)|, the blue color information piece Bpn is expressed by |Sb(n)|, and the green color information piece Gp2n−1 is expressed by $|Sg(n')| \times \frac{1}{2} + |Sg(n+1)| \times \frac{1}{2}$.

According to the processing in this embodiment, picture element information pieces can be obtained at a density approximately twice that in the image reading apparatus 104, so that fine reading can be performed.

FIGS. 21-24 are views for describing an image reading apparatus according to a sixth embodiment of the present invention. The image reading apparatus 106 shown in FIGS. 21-24 includes a contact image sensor 206 instead of the contact image sensor 202. Other structures are the same as those of the image reading apparatus 102. The contact image sensor 206 includes a sensor IC 306 instead of the sensor IC 302. Other structures are the same as those of the contact image sensor 202.

Figure 22:
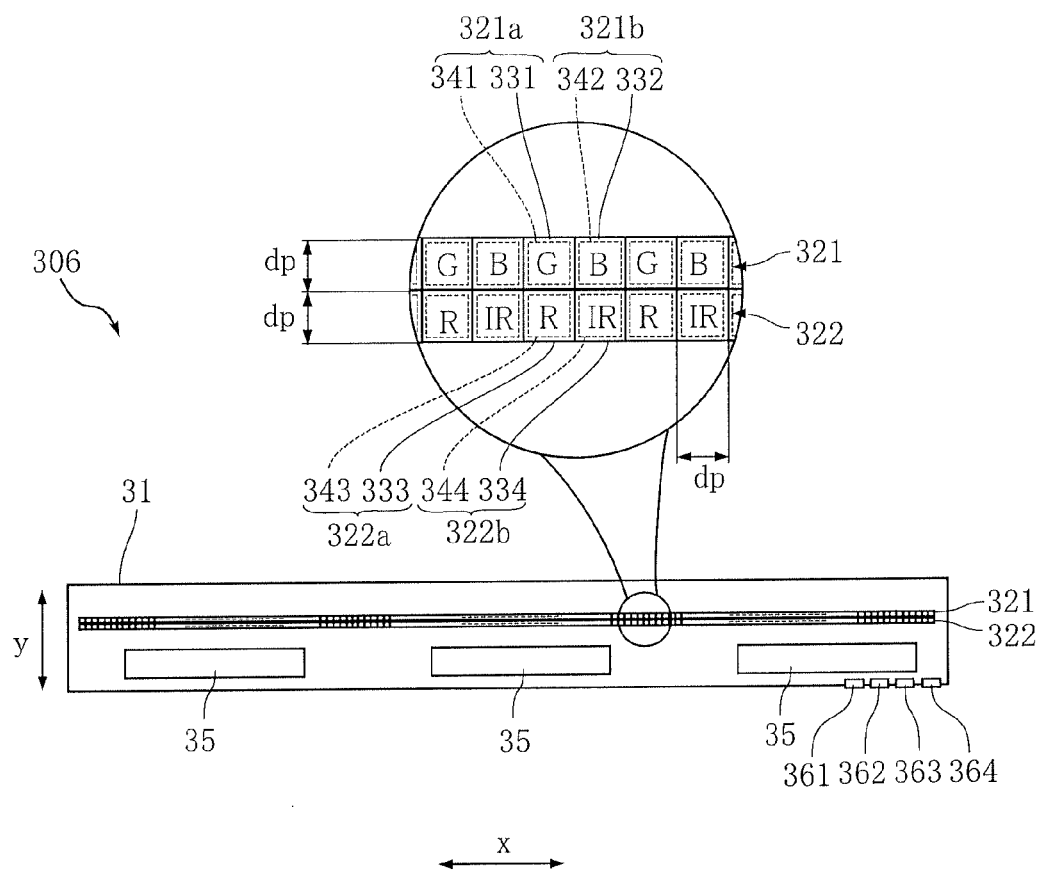
FIG. 22 is a schematic plan view of a sensor IC incorporated in the contact image sensor shown in FIG. 21.

As shown in FIG. 22, the sensor IC 306 of this embodiment includes a first light-receiving-element row 321 and a second light-receiving-element row 322 each consisting of a plurality of light receiving portions aligned in the primary scanning direction x. In this embodiment, each of the light receiving portions is square. In each of the first light-receiving-element row 321 and the second light-receiving-element row 322, the light receiving portions are arranged at a predetermined pitch dp. The second light-receiving-element row is provided at a position deviated from the first light-receiving-element row 321 in the secondary scanning direction y by a distance corresponding to the pitch dp.

Specifically, the first light-receiving-element row 321 consists of a plurality of light receiving portions 321a that receive green light and a plurality of light receiving portions 321b that receive blue light. The second light-receiving-element row 322 consists of a plurality of light receiving portions 322a that receive red light and a plurality of light receiving portions 322b that receive infrared light. For convenience, in FIGS. 22 and 23, the light receiving portions 321a are expressed as G, the light receiving portions 321b are expressed as B, the light receiving portions 322a are expressed as R and the light receiving portions 322b are expressed as IR.

Figure 23:
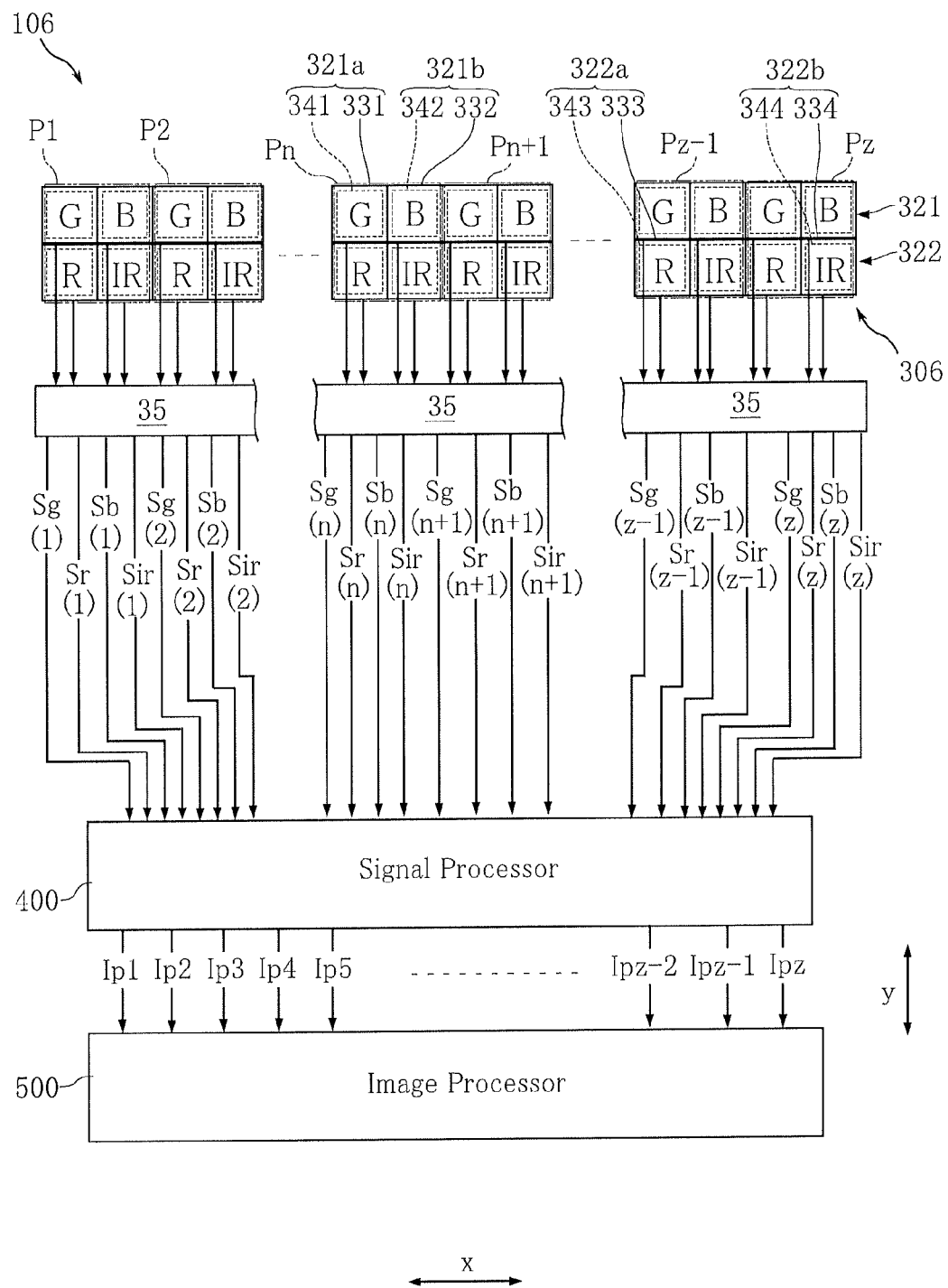
FIG. 23 is a view for describing the structure of the image reading apparatus shown in FIG. 21.

As shown in FIGS. 22 and 23, in the first light-receiving-element row 321, light receiving portions 321a and light receiving portions 321b are alternately arranged. In the second light-receiving-element row 322, light receiving portions 322a and light receiving portion 322b are alternately arranged. The position of each of the light receiving portions 322a in the primary scanning direction x is the same as that of a respective one of the light receiving portions 321a. The position of each of the light receiving portions 322b in the primary scanning direction x is the same as that of a respective one of the light receiving portions 321b. Hereinafter, for convenience of description, it is assumed that z light receiving portions 321a, z light receiving portions 321b, z light receiving portions 322a and z light receiving portions 322b are provided.

Each light receiving portion 321a of this embodiment includes a color filter 331 and a photo-electric conversion element 341. The color filter 331 has a structure similar to that of the color filter 33g of the sensor IC 302, and the photo-electric conversion element 341 has a structure similar to that of the photo-electric conversion element 34g of the sensor IC 302.

Each light receiving portion 321b of this embodiment includes a color filter 332 and a photo-electric conversion element 342. The color filter 332 has a structure similar to that of the color filter 33b of the sensor IC 302, and the photo-electric conversion element 342 has a structure similar to that of the photo-electric conversion element 34b of the sensor IC 302.

Each light receiving portion 322a of this embodiment includes a color filter 333 and a photo-electric conversion element 343. The color filter 333 has a structure similar to that of the color filter 33r of the sensor IC 302, and the photo-electric conversion element 343 has a structure similar to that of the photo-electric conversion element 34r of the sensor IC 302.

Each light receiving portion 322b of this embodiment includes a color filter 334 and a photo-electric conversion element 344. The color filter 334 has a structure similar to that of the color filter 33ir of the sensor IC 302, and the photo-electric conversion element 344 has a structure similar to that of the photo-electric conversion element 34ir of the sensor IC 302.

As shown in FIG. 23, the control circuit 35 of this embodiment amplifies electric signals from the light receiving portions 321a to output electric signals Sg(1) ... Sg(z). Here, an electric signal Sg(1) ... Sg(z) with a smaller number is based on a signal emitted from a light receiving portion 321a closer to the left end in FIG. 23 in the primary scanning direction x.

The control circuit 35 of this embodiment amplifies electric signals from the light receiving portions 321b to output electric signals Sb(1) ... Sb(z). Here, an electric signal Sb(1) ... Sb(z) with a smaller number is based on a signal emitted from a light receiving portion 321b closer to the left end in FIG. 23 in the primary scanning direction x.

The control circuit 35 of this embodiment amplifies electric signals from the light receiving portions 322a to output electric signals Sr(1) ... Sr(z). Here, an electric signal Sr(1) ... Sr(z) with a smaller number is based on a signal emitted from a light receiving portion 322a closer to the left end in FIG. 23 in the primary scanning direction x.

The control circuit 35 of this embodiment amplifies electric signals from the light receiving portions 322b to output electric signals Sir(1) ... Sir(z). Here, an electric signal Sir(1) ... Sir(z) with a smaller number is based on a signal emitted from a light receiving portion 322b closer to the left end in FIG. 23 in the primary scanning direction x.

The output terminal 361 of this embodiment outputs electric signals Sg(0) ... Sg(z) outputted by the control circuit 35 to the signal processor 400. The output terminal 362 outputs electric signals Sb(0) ... Sb(z) outputted by the control circuit 35 to the signal processor 400. The output terminal 363 outputs electric signals Sr(0) ... Sr(z) outputted by the control circuit 35 to the signal processor 400. The output terminal 364 outputs electric signals Sir(0) ... Sir(z) outputted by the control circuit 35 to the signal processor 400. Hereinafter, electric signals Sg(0) ... Sg(z) outputted from the output terminal 361 are collectively expressed as electric signal SG. Electric signals Sb(0) ... Sb(z) outputted from the output terminal 362 are collectively expressed as electric signal SB. Electric signals Sr(0) ... Sr(z) outputted from the output terminal 363 are collectively expressed as electric signal SR. Electric signals Sir(0) ... Sir(z) outputted from the output terminal 364 are collectively expressed as electric signal SIR.

The signal processor 400 of this embodiment receives electric signals SR, SG, SB and SIR outputted from the sensor IC 306, generates a plurality of picture element information pieces based on the received electric signals, and transmits the generated picture element information pieces to the image processor 500. Each of the picture element information pieces includes color information of four colors, red, green, blue and infrared. Based on the picture element information pieces, the image processor 500 forms a color read image of the read region 801.

The signal processor 400 of this embodiment performs processing by dividing the light receiving portions 321a, 321b, 322a and 322b into z light receiving groups P1 ... Pz shown in FIG. 23. The light receiving groups P1 ... Pz are successively arranged in numerical order in the primary scanning direction x. The signal processor 400 generates z picture element information pieces Ip1 ... Ipz corresponding to the light receiving groups P1 ... Pz, respectively.

Each of the light receiving groups P1. Pz consists of a light receiving portion 321a, a light receiving portion 321b and a light receiving portion 322a adjacent to the light receiving portion 321a, and a light receiving portion 322b adjacent to the light receiving portion 321b.

Figure 24:
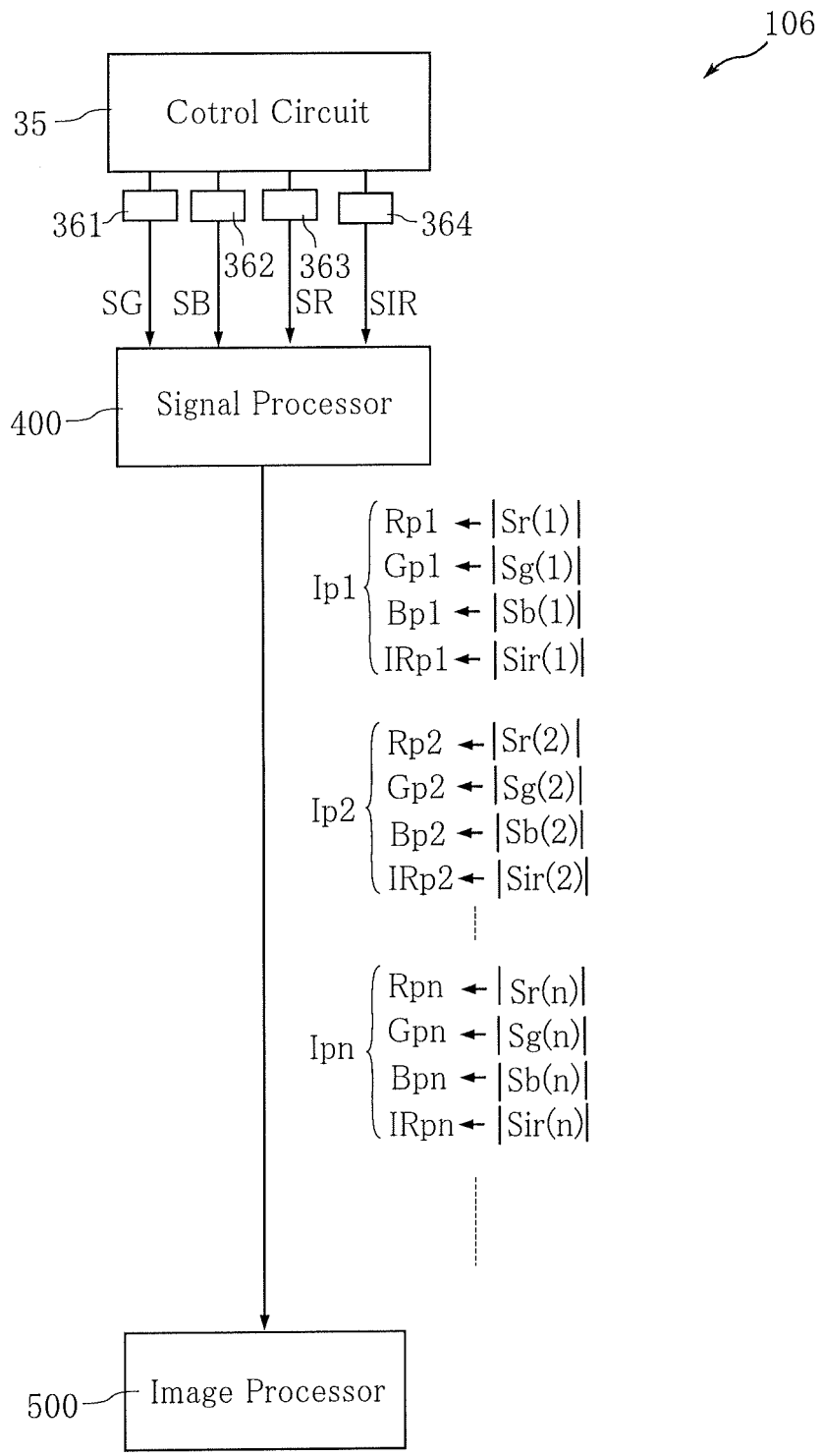
FIG. 24 is a view for describing the operation of the image reading apparatus shown in FIG. 21.

As shown in FIG. 24, each picture element information piece Ipn includes a green color information piece Gpn, a blue color information piece Bpn, a red color information piece Rpn and an infrared information piece IRpn, where n is an integer not smaller than 1 and not larger than z. The signal processor 400 generates a green color information piece Gpn based on an electric signal Sg(n) from the light receiving portion 321a included in the light receiving group Pn. For instance, the green color information piece Gpn is expressed by the intensity |Sg(n)| of the electric signal Sg(n).

The signal processor 400 generates a blue color information piece Bpn based on an electric signal Sb(n) from the light receiving portion 321b included in the light receiving group Pn. For instance, the blue color information piece Bpn is expressed by the intensity |Sb(n)| of the electric signal Sb(n).

The signal processor 400 generates a red color information piece Rpn based on an electric signal Sr(n) from the light receiving portion 322a included in the light receiving group Pn. For instance, the red color information piece Rpn is expressed by the intensity |Sr(n)| of the electric signal Sr(n).

The signal processor 400 generates an infrared information piece IRpn based on electric signal Sir(n) from the light receiving portion 322b included in the light receiving group Pn. For instance, the infrared information piece IRpn is expressed by the intensity |Sir(n)| of the electric signal Sir(n).

The controller 700 of this embodiment moves the read object 800 by a predetermined feeding width every time the contact image sensor 206 performs the scanning operation along the primary scanning direction x. In this embodiment, the feeding width of the read object 800 is twice the arrangement pitch dp of the light-receiving-element rows 321, 322. This feeding width equals to the total of the width of the light-receiving-element row 321 in the secondary scanning direction y and the width of the light-receiving-element row 322 in the secondary scanning direction y.

In the sensor IC 306 of this embodiment, four colors are read simultaneously by using two light-receiving-element rows 321 and 322. The width of the two light-receiving-element rows 321, 322 in the secondary scanning direction y can be shorter than the width of the rows in a conventional three-row type or four-row type.

Figure 25:
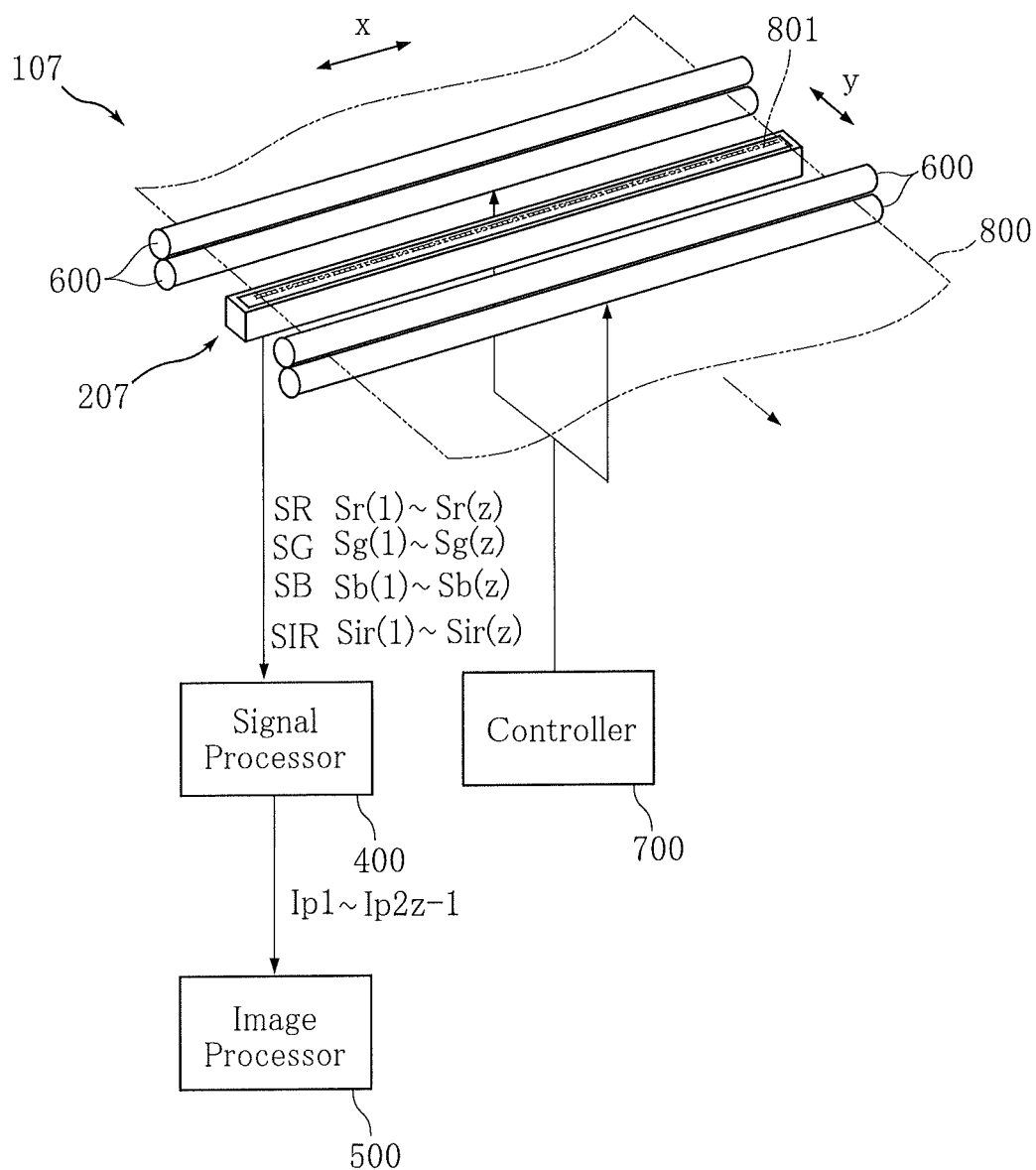
FIG. 25 is a schematic structural view showing an image reading apparatus according to a seventh embodiment of the present invention.
Figure 26:
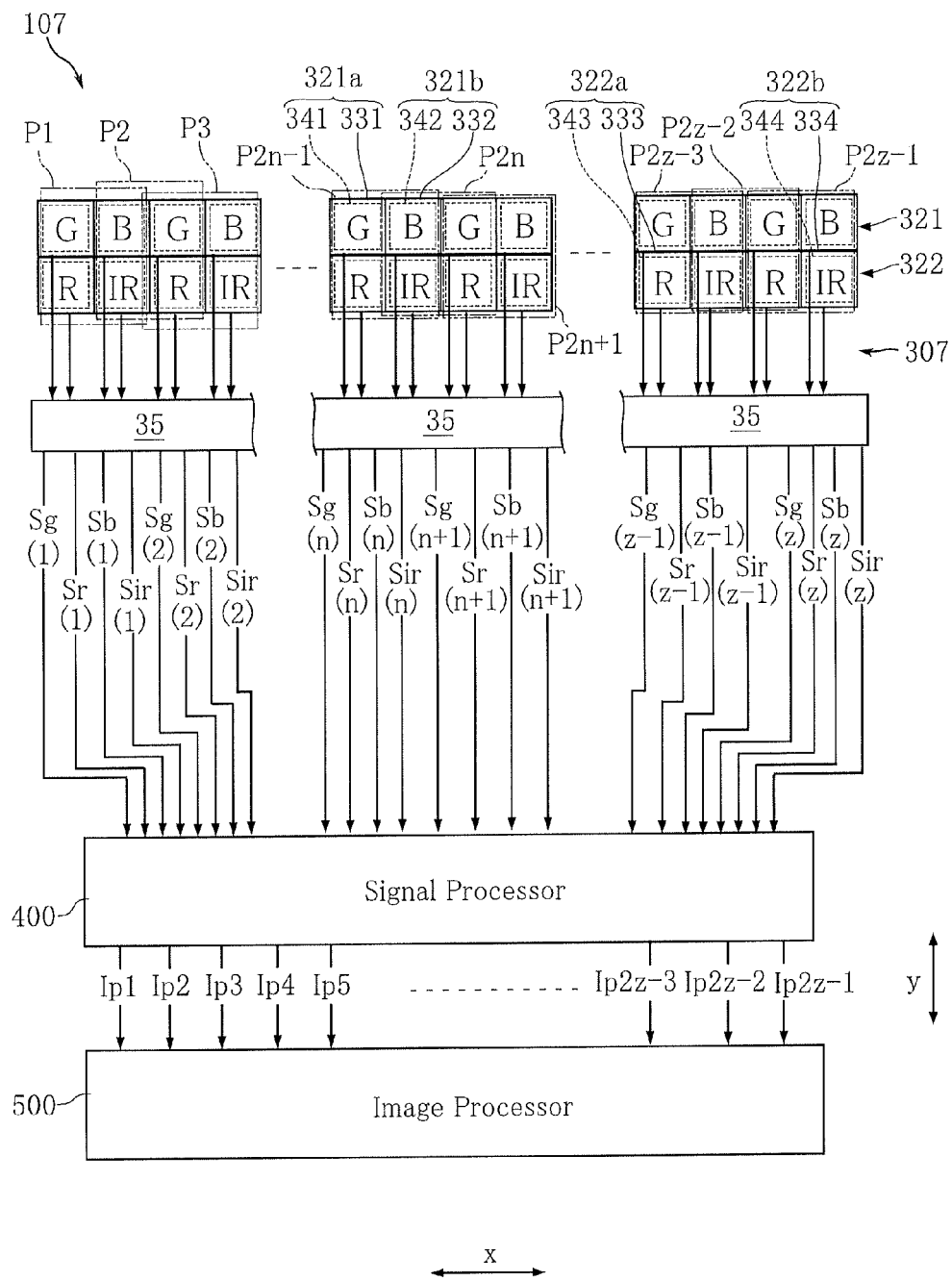
FIG. 26 is a view for describing the structure of the image reading apparatus shown in FIG. 25.
Figure 27:
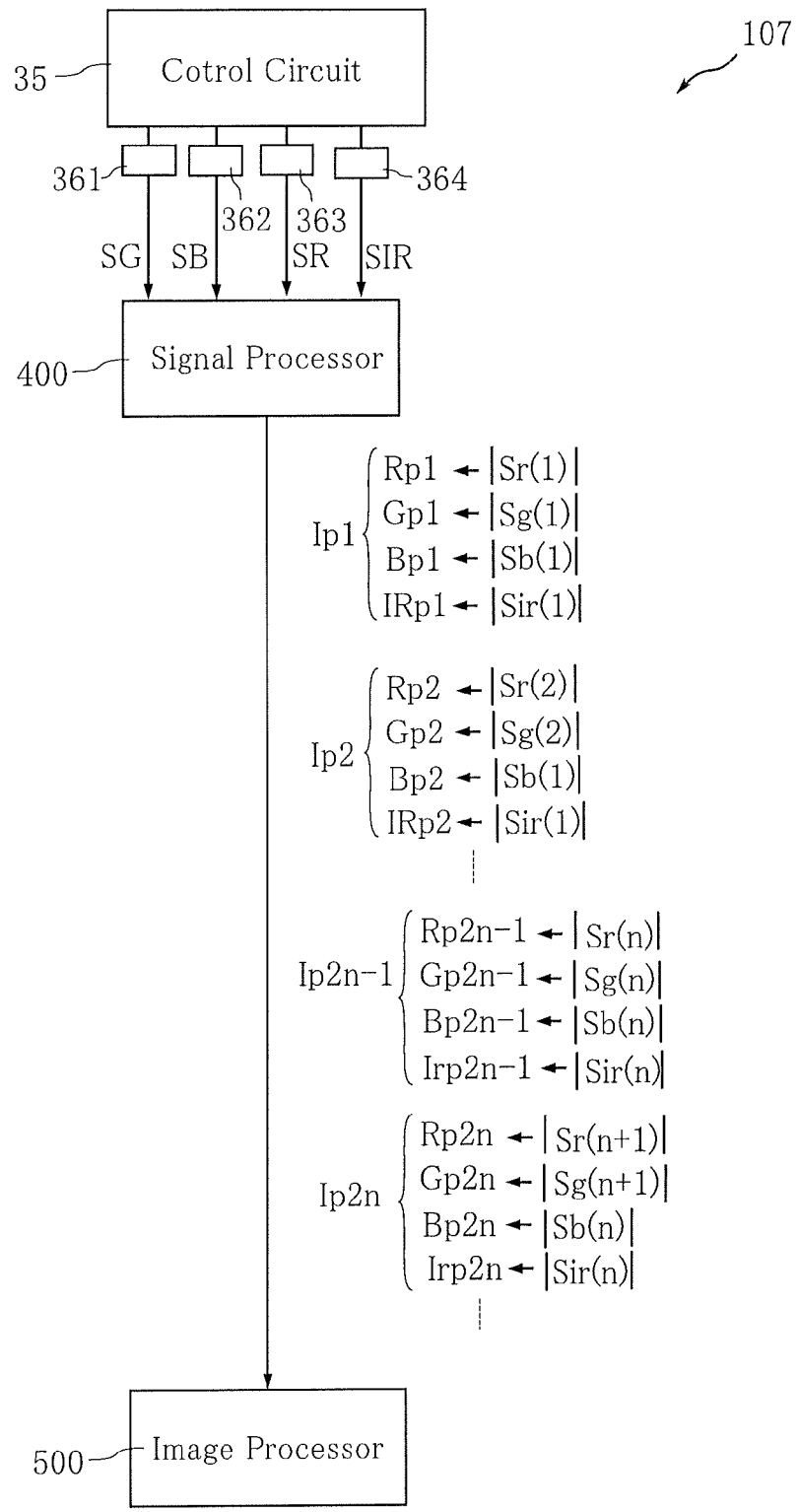
FIG. 27 is a view for describing the operation of the image reading apparatus shown in FIG. 25.
Figure 28:
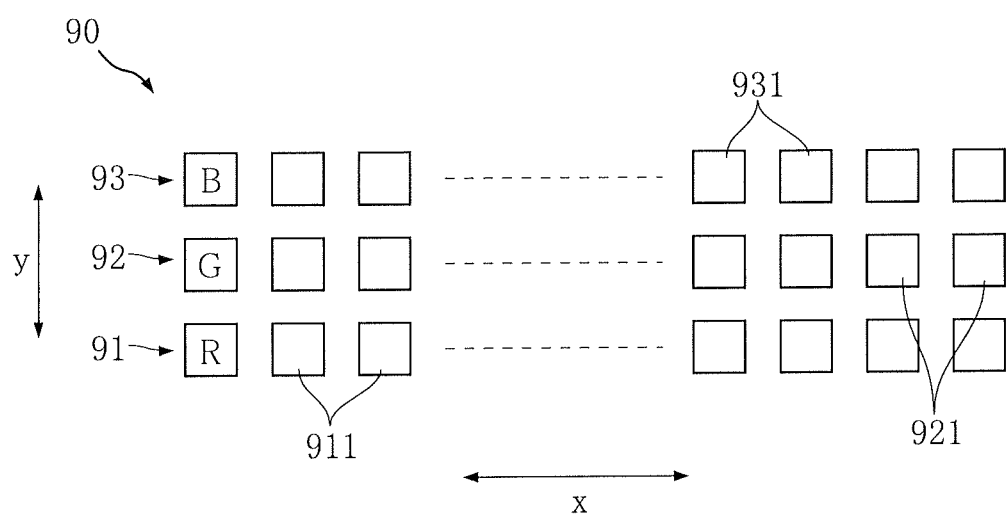
FIG. 28 shows light receiving portions of a conventional sensor IC.

FIGS. 25-27 are for describing an image reading apparatus according to a seventh embodiment of the present invention. The image reading apparatus 107 shown in FIGS. 25-27 differs from the image reading apparatus 106 in the processing by the signal processor 400 and the control by the controller 700. The image reading apparatus 107 includes a contact image sensor 207 including a sensor IC 107. The sensor IC 107 has the same structure as that of the sensor IC 106, and the contact image sensor 207 has the same structure as that of the contact image sensor 206.

As shown in FIG. 26, the signal processor 400 of this embodiment defines 2z−1 light receiving groups P1 . . . P2z−1 with respect to 4z light receiving portions 321a, 321b, 322a, 322b and generates picture element information pieces Ip1 . . . Ip2z−1 corresponding to the light receiving groups P1 . . . P2z−1, respectively. The light receiving groups P1 . . . P2z−1 are aligned at a pitch dp in the primary scanning direction x. For instance, the light receiving portion 321b and the light receiving portion 322b included in the light receiving group P1 are included in the light receiving group P2 as well.

Correspondingly to the above-described processing, the controller 700 of this embodiment moves the read object 800 by a feeding width equal to the pitch dp every time the contact image sensor 207 performs the scanning operation along the primary scanning direction x.

As shown in FIG. 27, the picture element information piece Ip2n−1 corresponding to the light receiving group P2n−1 includes a green color information piece Gp2n−1, a blue color information piece Bp2n−1, a red color information piece Rp2n−1 and an infrared information piece IRp2n−1, where n is an integer not smaller than 1 and not larger than z. The green color information piece Gp2n−1 is expressed by |Sg(n)|, the blue color information piece Bpn−1 is expressed by |Sb(n)|, the red color information piece Rp2n−1 is expressed by |Sr(n)|, and the infrared information piece IRp2n−1 is expressed by |Sir(n)|.

The picture element information piece Ip2n corresponding to the light receiving group P2n includes a green color information piece Gp2n, a blue color information piece Bp 2n, a red color information piece Rp2n and an infrared information piece IRpn. The green color information piece Gp2n is expressed by |Sg(n+1)|, the blue color information piece Bpn−1 is expressed by |Sb(n)|, the red color information piece Rp2n is expressed by |Sr(n+1)|, and the infrared information piece IRp2n is expressed by |Sir(n)|.

According to the processing in this embodiment, picture element information pieces can be obtained at a density approximately twice that in the image reading apparatus 106, so that fine reading can be performed.

The sensor IC, contact image sensor and image reading apparatus according to the present invention are not limited to the foregoing embodiments. The specific structure of the sensor IC, contact image sensor, and image reading apparatus according to the present invention can be varied in design in many ways.

For instance, although the light source 22 includes a light guide member 220, a red LED chip 221, a green LED chip 222 and a blue LED chip 223 in the above-described contact image sensor 201-207, a white light source such as a fluorescent lamp may be employed. Alternatively, a fluorescent lamp or the like and a light source including an LED chip and a light guide member may be used in combination.

Although the image reading apparatus 102, 106, 107 is designed to receive infrared light as light outside the visible light range, the image reading apparatus may be designed to receive ultraviolet light, not the infrared light. Alternatively, both the infrared light and the ultraviolet light may be received by e.g. increasing the kinds of color filter.

In the image reading apparatus 102, 106, 107, the light receiving portion 32ir or the light receiving portion 322b that receives infrared light includes color filter 33ir or 334 for passing infrared light. However, a structure that does not include a color filter 33ir or 334 is also possible. When a light receiving portion that does not include a color filter is provided, the light receiving portion receives light of all wavelengths emitted from the light source 22. Information on the light outside the visible light range can be obtained by subtracting from the electric signal outputted from that light receiving portion the electric signals related to red light, blue light and green light outputted from other light receiving portions.

The invention claimed is:

1. A sensor IC comprising:
a plurality of light receiving portions including a first light receiving portion that receives light of a first wavelength and a second light receiving portion that receives light of a second wavelength different from the first wavelength, the light receiving portions being arranged in a row along a primary scanning direction;
a plurality of additional light receiving portions provided at different positions from said plurality of light receiving portions in a secondary scanning direction, the additional light receiving portions being arranged in a row along the primary scanning direction, the additional light receiving portions including a third light receiving portion that receives light of a third wavelength different from the first wavelength and the second wavelength; and
a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion, wherein said plurality of light receiving portions include a plurality of first light receiving portions and a plurality of second light receiving portions, the first light receiving portions and the second light receiving portions being alternately arranged, said plurality of additional light receiving portions include a plurality of third light receiving portions and a plurality of fourth light receiving portions that receive light of a wavelength different from light of the third wavelength, the third light receiving portions and the fourth light receiving portions are alternately arranged, the fourth light receiving portions receive light of the first wavelength, the control circuit outputs a fourth electric signal corresponding to light of the first wavelength received by the fourth light receiving portions, each of the third light receiving portions is disposed at a same position as one of the first light receiving portions in the primary scanning direction, and each of the fourth light receiving portions is disposed at a same position as one of the second light receiving portions in the primary scanning direction.

2. A sensor IC, comprising:

a plurality of light receiving portions including a first light receiving portion that receives light of a first wavelength and a second light receiving portion that receives light of a second wavelength different from the first wavelength, the light receiving portions being arranged in a row along a primary scanning direction;

a plurality of additional light receiving portions provided at different positions from said plurality of light receiving portions in a secondary scanning direction, the additional light receiving portions being arranged in a row along the primary scanning direction, the additional light receiving portions including a third light receiving portion that receives light of a third wavelength different from the first wavelength and the second wavelength; and a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion, wherein said plurality of light receiving portions include a plurality of first light receiving portions and a plurality of second light receiving portions, the first light receiving portions and the second light receiving portions being alternately arranged, said plurality of additional light receiving portions include a plurality of third light receiving portions and a plurality of fourth light receiving portions that receive light of a wavelength different from light of the third wavelength, the third light receiving portions and the fourth light receiving portions are alternately arranged, the first light receiving portions, the second light receiving portions and the third light receiving portions receive visible light, and the fourth light receiving portions receive light of a fourth wavelength included in an invisible light range.

3. A contact image sensor comprising:

a sensor IC as set forth in claim 2;

a light source that emits light of the first wavelength, light of the second wavelength, light of the third wavelength and light of the fourth wavelength for illuminating a read object; and a lens array that focuses light from the read object onto the sensor IC to form an erected equal-magnification image.

4. The contact image sensor according to claim 3, wherein the light source includes: a light emitting portion provided with an LED chip; and a light guide member elongated in the primary scanning direction for guiding light emitted from the light emitting portion.

5. The contact image sensor according to claim 4, wherein the LED chip emits light of the fourth wavelength.

6. A contact image sensor comprising:

a sensor IC, provided with:

a plurality of light receiving portions including a first light receiving portion that receives light of a first wavelength, a second light receiving portion that receives light of a second wavelength different from the first wavelength, and a third light receiving portion that receives light of a third wavelength different from the first wavelength and the second wavelength, the light receiving portions being arranged in a row along a primary scanning direction; and a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion;

wherein the first light receiving portion, the second light receiving portion and the third light receiving portion receive visible light, the light receiving portions include a fourth light receiving portion that receives light of a fourth wavelength included in an invisible light range, and the control circuit outputs a fourth electric signal corresponding to light received by the fourth light receiving portion;

a light source that emits light of the first wavelength, light of the second wavelength, light of the third wavelength and light of the fourth wavelength for illuminating a read object; and a lens array that focuses light from the read object onto the sensor IC to form an erected equal-magnification image.

7. The contact image sensor according to claim 6, wherein the light source includes:

a light emitting portion provided with an LED chip; and a light guide member elongated in the primary scanning direction for guiding light emitted from the light emitting portion.

8. The contact image sensor according to claim 7, wherein the LED chip emits light of the fourth wavelength.

9. An image reading apparatus, comprising:

a sensor IC, provided with:

a plurality of light receiving portions including a first light receiving portion that receives light of a first wavelength, a second light receiving portion that receives light of a second wavelength different from the first wavelength, and a third light receiving portion that receives light of a third wavelength different from the first wavelength and the second wavelength, the light receiving portions being arranged in a row along a primary scanning direction; and a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion;

a light source that emits light of the first wavelength, light of the second wavelength and light of the third wavelength for illuminating a read object;

a lens array that focuses light from the read object onto the sensor IC to form an erected equal-magnification image; and a signal processor that receives the first electric signal, the second electric signal and the third electric signal, wherein the signal processor outputs a plurality of picture element information pieces, each of which includes: a first color information piece based on the first electric signal; a second color information piece based on the second electric signal; and a third color information piece based on the third electric signal and every time the sensor IC performs scanning, the signal processor outputs a larger number of picture element information pieces than a number of the first light receiving portions.

10. The image reading apparatus according to claim 9, wherein the signal processor performs processing by dividing the light receiving portions into a plurality of light receiving groups aligned along the primary scanning direction, and each of the light receiving groups includes the first light receiving portion, the second light receiving portion and the third light receiving portion.

11. The image reading apparatus according to claim 10, wherein the light receiving groups include a first light receiving group and a second light receiving group positioned next to the first light receiving group, and the signal processor outputs a first picture element information piece that is one of the picture element information pieces, the first picture element information piece including:

a first color information piece based on a first electric signal from a first light receiving portion belonging to the second light receiving group;

a second color information piece obtained from both a second electric signal from a second light receiving portion belonging to the first light receiving group and a second electric signal from a second light receiving portion belonging to the second light receiving group, and a third color information piece obtained from both a third electric signal from a third light receiving portion belonging to the first light receiving group and a third electric signal from a third light receiving portion belonging to the second light receiving group.

12. The image reading apparatus according to claim 11, wherein the light receiving groups further include a third light receiving group positioned next to the second light receiving group, and the signal processor outputs a second picture element information piece that is one of the picture element information pieces, the second picture element information piece including:

a first color information piece obtained from both a first electric signal from the first light receiving portion belonging to the second light receiving group and a first electric signal from a first light receiving portion belonging to the third light receiving group;

a second color information piece based on a second electric signal from the second light receiving portion belonging to the second light receiving group; and a third color information piece obtained from both a third electric signal from the third light receiving portion belonging to the first light receiving group and a third electric signal from the third light receiving portion belonging to the second light receiving group.

13. The image reading apparatus according to claim 9, wherein the signal processor performs processing by dividing the light receiving portions into a plurality of light receiving groups aligned along the primary scanning direction, and the light receiving groups include: a first light receiving group including the first light receiving portion and the second light receiving portion; and a second light receiving group positioned next to the first light receiving group and including the second light receiving portion and the third light receiving portion.

14. The image reading apparatus according to claim 13, wherein the signal processor outputs a first picture element information piece that is one of the picture element information pieces, the first picture element information piece including:

a first color information piece based on a first electric signal from a first light receiving portion belonging to the first light receiving group;

a second color information piece based on a second electric signal from a second light receiving portion belonging to the first light receiving group; and a third color information piece obtained by using a third electric signal from a third light receiving portion belonging to the second light receiving group.

15. The image reading apparatus according to claim 14, wherein the light receiving groups include a third light receiving group including the first light receiving portion and the second light receiving portion, positioned on an opposite side of the first light receiving group with respect to the second light receiving group and positioned adjacent to the second light receiving group, and the signal processor outputs a second picture element information piece that is one of the picture element information pieces, the second picture element information piece including:

a first color information piece obtained by using a first electric signal from a first light receiving portion belonging to the first light receiving group and a first electric signal from a first light receiving portion belonging to the third light receiving group;

a second color information piece based on a second electric signal from a second light receiving portion belonging to the second light receiving group; and a third color information piece based on a third electric signal from a third light receiving portion belonging to the second light receiving group.

16. An image reading apparatus comprising:

a contact image sensor including a sensor IC, a light source and a lens array;

a transferer;

a controller; and a signal processor;

wherein the sensor IC comprises:

a plurality of light receiving portions including a first light receiving portion that receives light of a first wavelength and a second light receiving portion that receives light of a second wavelength different from the first wavelength, the light receiving portions being arranged in a row along a primary scanning direction;

a plurality of additional light receiving portions provided at different positions from said plurality of light receiving portions in a secondary scanning direction, the additional light receiving portions being arranged in a row along the primary scanning direction, the additional light receiving portions including a third light receiving portion that receives light of a third wavelength different from the first wavelength and the second wavelength; and a control circuit that outputs a first electric signal corresponding to light of the first wavelength received by the first light receiving portion, a second electric signal corresponding to light of the second wavelength received by the second light receiving portion, and a third electric signal corresponding to light of the third wavelength received by the third light receiving portion;

wherein the light source emits light of the first wavelength, light of the second wavelength and light of the third wavelength for illuminating a read object, the lens array focuses light from the read object onto the sensor IC to form an erected equal-magnification image, the transferer is configured to move the read object relative to the contact image sensor, the controller is configured to control the transferer, and the signal processor is configured to receive the first electric signal, the second electric signal and the third electric signal, wherein the signal processor outputs a plurality of picture element information pieces each of which includes: a first color information piece based on the first electric signal; a second color information piece based on the second electric signal; and a third color information piece based on the third electric signal.

17. The image reading apparatus according to claim 16, wherein the light receiving portions include the first light receiving portion and the second light receiving portion arranged adjacent to each other, the additional light receiving portions include the third light receiving portion arranged adjacent to the first light receiving portion, and the signal processor outputs a first picture element information piece that is one of the picture element information pieces, the first picture element information piece including:

a first color information piece based on a first electric signal from the first light receiving portion;

a second color information piece based on a second electric signal from the second light receiving portion; and a third color information piece based on a third electric signal from the third light receiving portion.

18. The image reading apparatus according to claim 17, wherein the controller controls the transferer in such a manner that the transferer moves the read object relative to the contact image sensor by a feeding width approximately equal to a sum of a pitch of the light receiving portions and a pitch of the additional light receiving portions every time the sensor IC performs scanning operation.

19. The image reading apparatus according to claim 17, wherein the light receiving portions include an additional first light receiving portion positioned on an opposite side of the first light receiving portion with respect to the second light receiving portion and positioned adjacent to the second light receiving portion, the additional light receiving portions include an additional third light receiving portion adjacent to the additional first light receiving portion, and the signal processor further outputs a second picture element information piece that is one of the picture element information pieces, the second picture element information piece including:

a first color information piece based on a first electric signal from the additional first light receiving portion;

a second color information piece based on a second electric signal from the second light receiving portion; and a third color information piece obtained by using a third electric signal from the additional third light receiving portion.

20. The image reading apparatus according to claim 19, wherein the controller controls the transferer in such a manner that the transferer moves the read object relative to the contact image sensor by a feeding width corresponding to a pitch of the light receiving portions every time the sensor IC performs scanning operation.

\* \* \* \* \*